United States Patent
Wang

(10) Patent No.: US 10,269,556 B2
(45) Date of Patent: Apr. 23, 2019

(54) METHOD AND APPARATUS FOR CLEANING SEMICONDUCTOR DEVICE STRUCTURE WITH GAS FLOW

(71) Applicant: Taiwan Semiconductor Manufacturing Co., Ltd., Hsinchu (TW)

(72) Inventor: Po-Shu Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/650,249

(22) Filed: Jul. 14, 2017

(65) Prior Publication Data
US 2019/0019671 A1    Jan. 17, 2019

(51) Int. Cl.
*H01L 21/02* (2006.01)
(52) U.S. Cl.
CPC .............................. *H01L 21/02049* (2013.01)

(58) Field of Classification Search
CPC .................................................. H01L 21/02049
See application file for complete search history.

(56) References Cited

U.S. PATENT DOCUMENTS

| | | | |
|---|---|---|---|
| 5,456,758 A * | 10/1995 | Menon .................. | B08B 7/0092 134/31 |
| 5,494,526 A * | 2/1996 | Paranjpe ................... | B08B 3/12 134/1 |
| 2009/0243009 A1* | 10/2009 | Li ........................ | G11C 11/5607 257/422 |
| 2011/0155177 A1* | 6/2011 | Tamura ............. | H01L 21/02057 134/18 |

* cited by examiner

*Primary Examiner* — Duy Vu N Deo
(74) *Attorney, Agent, or Firm* — Birch, Stewart, Kolasch & Birch, LLP

(57) ABSTRACT

A method and apparatus for cleaning a semiconductor device structure are provided. The method includes providing a substrate, forming a material layer over the substrate. The material layer has a top surface. The method further includes cleaning the top surface of the material layer by producing a gas flow on the top surface.

20 Claims, 18 Drawing Sheets

METHOD AND APPARATUS FOR CLEANING SEMICONDUCTOR DEVICE STRUCTURE WITH GAS FLOW

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Therefore, it is a challenge to form reliable semiconductor device structures with improved yield.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
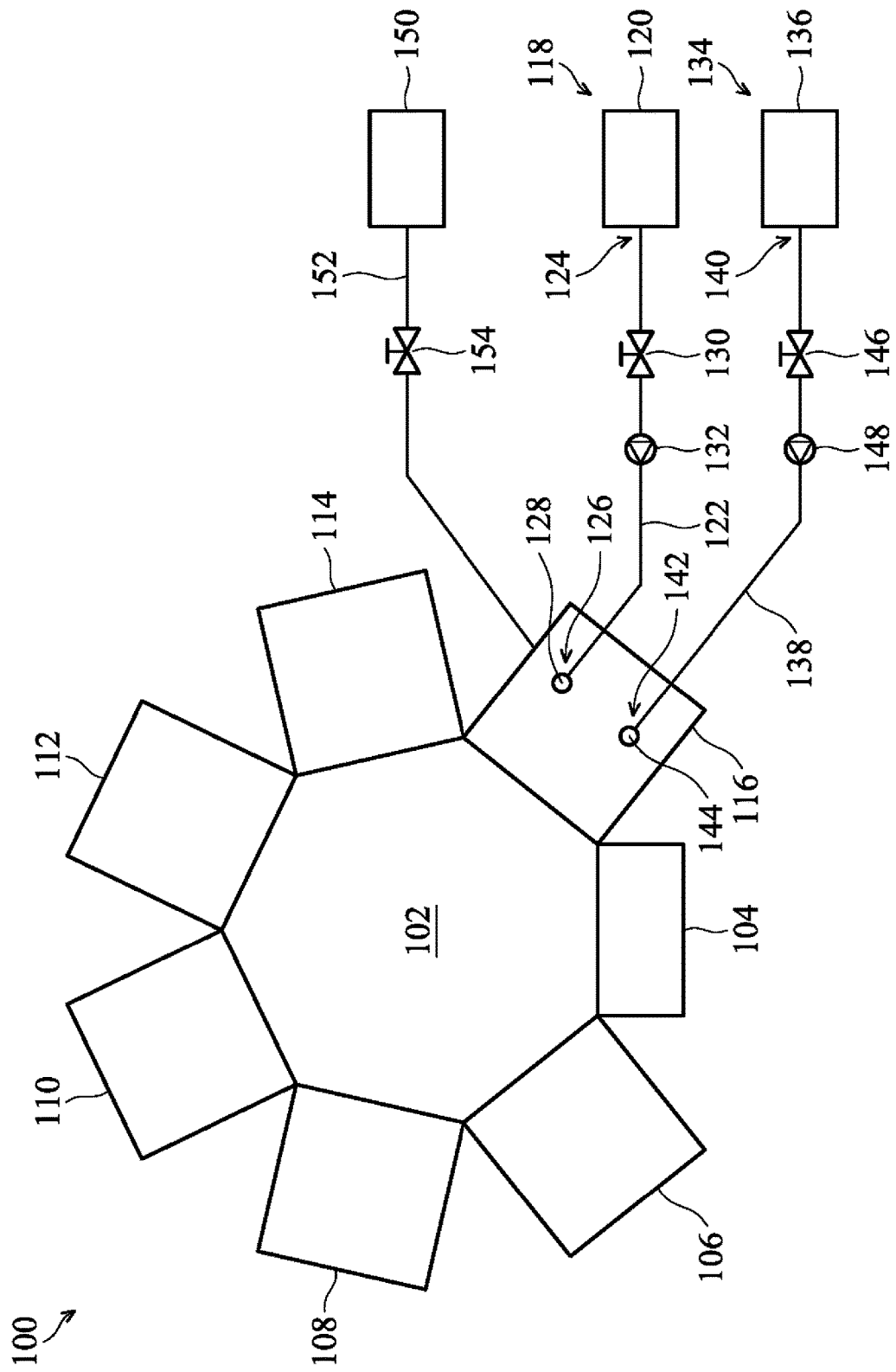
FIG. 1 is a top view of an apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn at different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a top view of an apparatus 100 in accordance with some embodiments of the present disclosure. In some embodiments, the apparatus 100 is a deposition apparatus, in accordance with some embodiments. In some embodiments, the apparatus 100 is a physical vapor deposition apparatus, in accordance with some embodiments. In some embodiments, the apparatus 100 is configured to deposit a material layer over a substrate and configured to clean the deposited material layer.

As shown in FIG. 1, the apparatus 100 includes a transfer port 102, in accordance with some embodiments. As shown in FIG. 1, the apparatus 100 further includes a load port 104 positioned adjacent to the transfer port 102, in accordance with some embodiments. In some embodiments, the load port 104 is configured to transfer the wafers into the transfer port 102 or transfer the wafers out of the transfer port 102.

As shown in FIG. 1, the apparatus 100 further includes a first processing chamber 106 connected to the transfer port 102, in accordance with some embodiments. In some embodiments, the first processing chamber 106 is a physical vapor deposition process chamber. In some embodiments, the first processing chamber 106 is able to perform a sputtering process, a resistive thermal evaporation process, an electron beam evaporation process, another applicable physical vapor deposition process, or a combination thereof.

In some embodiments, the first processing chamber 106 is configured to deposit a material layer over a substrate. In some embodiments, the first processing chamber 106 is configured to deposit a material layer by performing a physical vapor deposition process.

As shown in FIG. 1, the apparatus 100 further includes a second processing chamber 108 connected to the transfer port 102, in accordance with some embodiments. In some embodiments, the second processing chamber 108 is a physical vapor deposition process chamber. In some embodiments, the second processing chamber 108 is able to perform a sputtering process, a resistive thermal evaporation process, an electron beam evaporation process, another applicable physical vapor deposition process, or a combination thereof.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

In some embodiments, the second processing chamber 108 is configured to deposit a material layer over a substrate. In some embodiments, the second processing chamber 108 is configured to deposit a material layer by performing a physical vapor deposition process.

As shown in FIG. 1, the apparatus 100 further includes a third processing chamber 110 connected to the transfer port 102, in accordance with some embodiments. In some embodiments, the third processing chamber 110 is a physical vapor deposition process chamber. In some embodiments, the third processing chamber 110 is able to perform a sputtering process, a resistive thermal evaporation process, an electron beam evaporation process, another applicable physical vapor deposition process, or a combination thereof.

In some embodiments, the third processing chamber 110 is configured to deposit a material layer over a substrate. In some embodiments, the third processing chamber 110 is configured to deposit a material layer by performing a physical vapor deposition process.

As shown in FIG. 1, the apparatus 100 further includes a fourth processing chamber 112 connected to the transfer port 102, in accordance with some embodiments. In some embodiments, the fourth processing chamber 112 is a physical vapor deposition process chamber. In some embodiments, the fourth processing chamber 112 is able to perform a sputtering process, a resistive thermal evaporation process, an electron beam evaporation process, another applicable physical vapor deposition process, or a combination thereof.

In some embodiments, the fourth processing chamber 112 is configured to deposit a material layer over a substrate. In some embodiments, the fourth processing chamber 112 is configured to deposit a material layer by performing a physical vapor deposition process.

As shown in FIG. 1, the apparatus 100 further includes a fifth processing chamber 114 connected to the transfer port 102, in accordance with some embodiments. In some embodiments, the fifth processing chamber 114 is a physical vapor deposition process chamber. In some embodiments, the fifth processing chamber 114 is able to perform a sputtering process, a resistive thermal evaporation process, an electron beam evaporation process, another applicable physical vapor deposition process, or a combination thereof.

In some embodiments, the fifth processing chamber 114 is configured to deposit a material layer over a substrate. In some embodiments, the fifth processing chamber 114 is configured to deposit a material layer by performing a physical vapor deposition process.

As shown in FIG. 1, the apparatus 100 further includes a cleaning chamber 116 connected to the transfer port 102, in accordance with some embodiments. In some embodiments, the transfer port 102 is configured to transfer a wafer between the first processing chamber 106, the second processing chamber 108, the third processing chamber 110, the fourth processing chamber 112, the fifth processing chamber 114 and the cleaning chamber 116.

As shown in FIG. 1, the apparatus 100 further includes a cleaning substance dispensing unit 118 connected to the cleaning chamber 116, in accordance with some embodiments. In some embodiments, the cleaning substance dispensing unit 118 is configured to dispense a volatile cleaning substance in a solid and/or liquid state onto a wafer in the cleaning chamber 116 to clean the wafer.

Figure 2A:
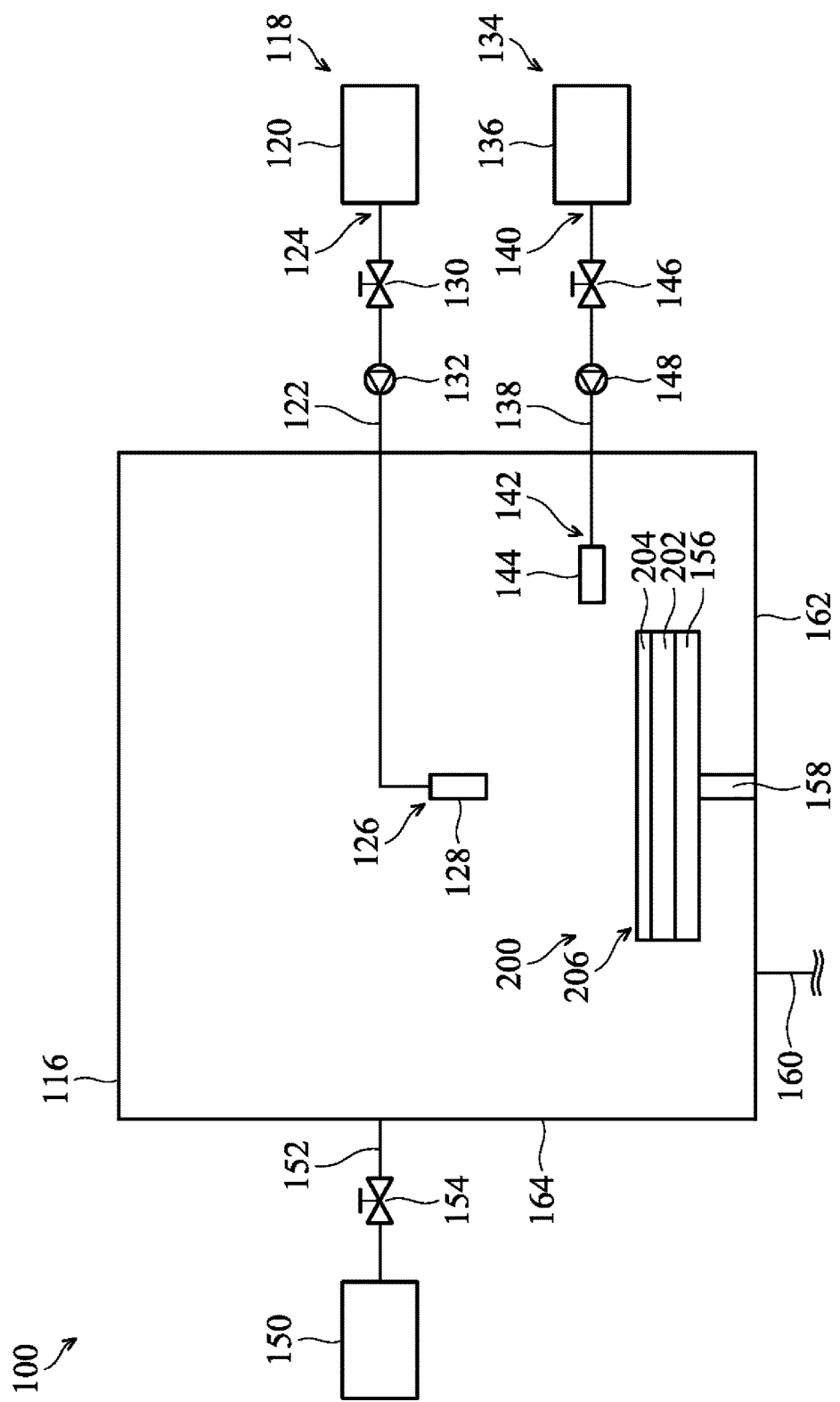
FIG. 2A is a cross-sectional view of a cleaning chamber in accordance with some embodiments.

FIG. 2A is a cross-sectional view of a cleaning chamber 116 and the cleaning substance dispensing unit 118 in accordance with some embodiments. As shown in FIGS. 1 and 2A, the cleaning substance dispensing unit 118 includes a first container 120 used to store the volatile cleaning substance in solid state and/or liquid state, in accordance with some embodiments. Still referring to FIGS. 1 and 2A, the cleaning substance dispensing unit 118 further includes a first pipe 122 having a first end 124 and a second end 126, in accordance with some embodiments. As shown in FIGS. 1 and 2A, the first end 124 is positioned outside the cleaning chamber 116 and is connected to the first container 120, in accordance with some embodiments. Still referring to FIGS. 1 and 2A, the cleaning substance dispensing unit 118 further includes a first nozzle 128 in the cleaning chamber 116, in accordance with some embodiments. Still referring to FIGS. 1 and 2A, the second end 126 of the first pipe 122 is positioned in the cleaning chamber 116 and is connected to the first nozzle 128, in accordance with some embodiments.

Still referring to FIGS. 1 and 2A, the cleaning substance dispensing unit 118 further includes a first valve 130 provided on the first pipe 122, in accordance with some embodiments. In some embodiments, the first valve 130 is used to regulate the flow of the substance in the first pipe 122. In some embodiments, the apparatus 100 further includes a host computer (not shown) to control the first valve 130 according to a predetermined setting.

Still referring to FIGS. 1 and 2A, the cleaning substance dispensing unit 118 further includes a first pump 132 provided on the first pipe 122, in accordance with some embodiments. In some embodiments, the first pump 132 is used to pump the substance from the first container 120 to the first nozzle 128 through the first pipe 122. In some embodiments, the host computer of the apparatus 100 controls the first pump 132 according to a predetermined setting.

In some embodiments, the cleaning chamber 116 and the cleaning substance dispensing unit 118 are configured to clean the wafer or the semiconductor device structure which is placed in the cleaning chamber.

As shown in FIGS. 1 and 2A, the apparatus 100 further includes a gas providing unit 134 connected to the cleaning chamber 116, in accordance with some embodiments. In some embodiments, the gas providing unit 134 is configured to provide gas to the wafer in the cleaning chamber 116.

As shown in FIGS. 1 and 2A, the gas providing unit 134 includes a second container 136 used to store the gas, in accordance with some embodiments. Still referring to FIGS. 1 and 2A, the gas providing unit 134 further includes a second pipe 138 having a third end 140 and a fourth end 142, in accordance with some embodiments. As shown in FIGS. 1 and 2A, the third end 140 is positioned outside the cleaning chamber 116 and is connected to the second container 136, in accordance with some embodiments. Still referring to FIGS. 1 and 2A, the gas providing unit 134 further includes a second nozzle 144 in the cleaning chamber 116, in accordance with some embodiments. Still referring to FIGS. 1 and 2A, the fourth end 142 of the second pipe 138 is positioned in the cleaning chamber 116 and is connected to the second nozzle 144, in accordance with some embodiments.

Still referring to FIGS. 1 and 2A, the gas providing unit 134 further includes a second valve 146 provided on the second pipe 138, in accordance with some embodiments. In some embodiments, the second valve 146 is used to regulate the flow of the gas in the second pipe 138. In some embodiments, the host computer of the apparatus 100 controls the second valve 146 according to a predetermined setting.

Still referring to FIGS. 1 and 2A, the gas providing unit 134 further includes a second pump 148 provided on the second pipe 138, in accordance with some embodiments. In some embodiments, the second pump 148 is used to pump the gas from the second container 136 to the second nozzle 144 through the second pipe 138. In some embodiments, the host computer of the apparatus 100 controls the second pump 148 according to a predetermined setting.

In some embodiments, the cleaning chamber 116, the cleaning substance dispensing unit 118 and the gas providing unit 134 are configured to clean the wafer or the semiconductor device structure which is placed in the cleaning chamber.

Still referring to FIGS. 1 and 2A, the apparatus 100 further includes a pressure control unit 150 connected to the cleaning chamber 116, in accordance with some embodiments. In some embodiments, the pressure control unit 150 is configured to control the pressure in the cleaning chamber 116.

As shown in FIGS. 1 and 2A, the apparatus 100 further includes a third pipe 152 connecting the pressure control unit 150 and the cleaning chamber 116, in accordance with some embodiments. As shown in FIGS. 1 and 2A, the apparatus 100 further includes a third valve 154 provided on the third pipe 152, in accordance with some embodiments. In some embodiments, the host computer of the apparatus 100 controls the third valve 154 according to a predetermined setting.

As shown in FIG. 2A, the apparatus 100 further includes a stage 156 in the cleaning chamber 116, in accordance with some embodiments. In some embodiments, the stage 156 is configured to carry the wafer in the cleaning chamber 116. In some embodiments, the stage 156 is a chuck.

As shown in FIG. 2A, the apparatus 100 further includes an axis 158 configured to support the stage 156, in accordance with some embodiments. As shown in FIG. 2A, the cleaning chamber 116 includes an outlet 160 to discharge waste liquid or gaseous fluid, in accordance with some embodiments.

According to some embodiments of the present disclosure, a method for cleaning a semiconductor device structure is also provided. As shown in FIG. 2A, a wafer 200 is provided and placed over the stage 156, in accordance with some embodiments. In some embodiments, the wafer 200 is also referred to as a semiconductor device structure 200.

As shown in FIG. 2A, the wafer 200 includes a semiconductor substrate 202 and a material layer 204 over the semiconductor substrate 202. In some embodiments, the material layer 204 has a top surface 206.

In some embodiments, the semiconductor substrate 202 is a bulk semiconductor substrate. For example, the semiconductor substrate 202 is a silicon semiconductor substrate. The semiconductor substrate 202 may include silicon or another elementary semiconductor material such as germanium. In some other embodiments, the semiconductor substrate 202 includes a compound semiconductor. The compound semiconductor may include gallium arsenide, silicon carbide, indium arsenide, indium phosphide, another suitable material, or a combination thereof.

In some embodiments, the semiconductor substrate 202 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 202 is an un-doped substrate. However, in some other embodiments, the semiconductor substrate 202 is a doped substrate such as a P-type substrate or an N-type substrate.

In some embodiments, an interconnection structure is formed in and/or over the semiconductor substrate 202. The interconnection structure also includes multiple conductive features formed in the interlayer dielectric layers. The conductive features may include conductive lines, conductive vias, and/or conductive contacts.

In some embodiments, various device elements are formed in the semiconductor substrate 202. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through the interconnection structure in and/or over the semiconductor substrate 202 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

In some embodiments, the material layer 204 includes a magnetic material layer, a tunnel barrier layer, a conductive layer, an electrode layer, another suitable material layer, or a combination thereof. In some embodiments, the material of the magnetic material layer includes platinum magnesium (PtMn), or cobalt (Co)-iron (Fe) containing material such as cobalt iron alloy (CoFe) or cobalt iron boron (CoFeB). In some embodiments, the material of the tunnel barrier layer includes magnesium oxide (MgO). In some embodiments, the material of the conductive layer or the electrode layer includes copper, aluminum, tungsten, gold, chromium, nickel, platinum, titanium, iridium, rhodium, an alloy thereof, another conductive material, or a combination thereof.

In some embodiments, the semiconductor substrate 202 is placed into the first processing chamber 106, the second processing chamber 108, the third processing chamber 110, the fourth processing chamber 112 or the fifth processing chamber 114 shown in FIG. 1. Afterwards, in some embodiments, the material layer 204 is deposited over the semiconductor substrate 202 by a physical vapor deposition process. In some embodiments, the physical vapor deposition process includes a sputtering process, a resistive thermal evaporation process, an electron beam evaporation process, another applicable physical vapor deposition process, or a combination thereof.

In some embodiments, after the material layer 204 is deposited over the semiconductor substrate 202, the semiconductor substrate 202 and the material layer 204 are moved into the cleaning chamber 116 and are placed over the stage 156, as shown in FIG. 2A.

Figure 2B:
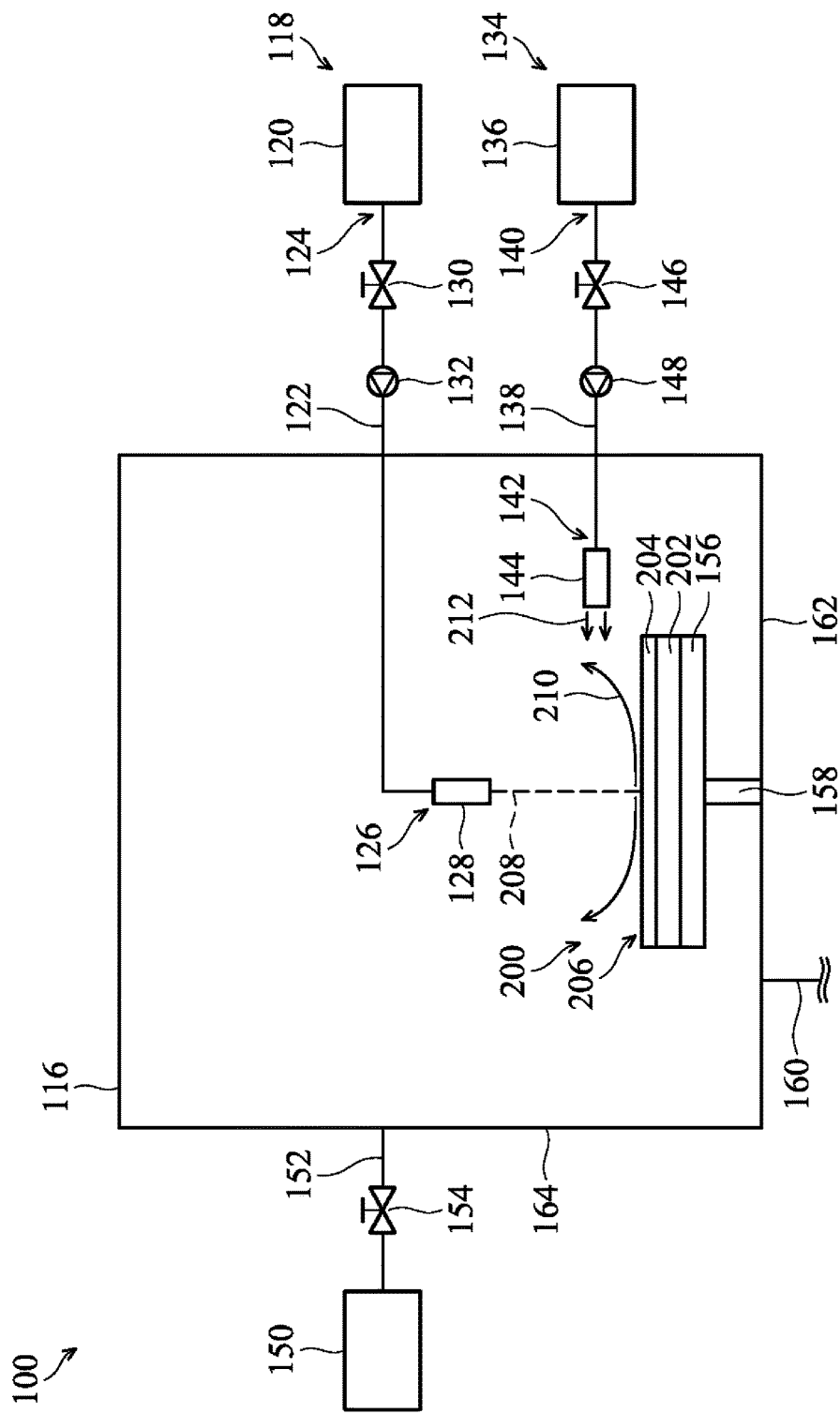
FIG. 2B is a cross-sectional view of a cleaning chamber in accordance with some embodiments.

Afterwards, as shown in FIG. 2B, the top surface 206 of the material layer 204 is cleaned by producing a gas flow on the top surface 206, in accordance with some embodiments. As shown in FIG. 2B, the process for producing the gas flow includes providing a volatile cleaning substance 208 in a solid and/or liquid state onto the top surface 206 of the material layer 204, in accordance with some embodiments. In some embodiments, the volatile cleaning substance 208 includes nitrogen, carbon dioxide, oxygen, hydrogen, another suitable material, or a combination thereof.

In some embodiments, the volatile cleaning substance 208 in a solid and/or liquid state is stored in the first container 120. During the cleaning process, the first valve 130 is opened, and the volatile cleaning substance 208 in a solid and/or liquid state is provided from the first container 120 to the top surface 206 of the material layer 204 through the first pipe 122 and the first nozzle 128 by the first pump 132.

However, the embodiments of the present disclosure are not limited thereto. The volatile cleaning substance 208 in a solid and/or liquid state may be provided onto the top surface 206 of the material layer 204 by any applicable process.

In some embodiments, the volatile cleaning substance 208 in a solid and/or liquid state is provided onto the top surface 206 in a direction substantially perpendicular to the top surface 206. In some other embodiments, the volatile cleaning substance 208 in a solid and/or liquid state is provided onto the top surface 206 in a tilted direction with respect to the top surface 206. However, the embodiments of the present disclosure are not limited thereto. The volatile cleaning substance 208 in a solid and/or liquid state may be provided onto the top surface 206 in any direction.

In some embodiments, the temperature of the material layer 204 is higher than the temperature of volatile cleaning substance 208 in solid state and/or liquid state. Therefore, in some embodiments, after the volatile cleaning substance 208 in a solid and/or liquid state is provided onto the top surface 206, the volatile cleaning substance 208 in a solid and/or liquid state is converted into a cleaning substance 210 in a gaseous state to produce the gas flow, in accordance with some embodiments.

In some embodiments, as shown in FIG. 2B, after the volatile cleaning substance 208 in a solid and/or liquid state touches or contacts the top surface 206, the volatile cleaning substance 208 in a solid and/or liquid state is converted into a cleaning substance 210 in a gaseous state to produce the gas flow, in accordance with some embodiments.

As shown in FIG. 2B, the gaseous cleaning substance 210 flows away from the top surface 206 of the material layer 204, in accordance with some embodiments. As shown in FIG. 2B, the gaseous cleaning substance 210 flows from the central part of the top surface 206 to the peripheral part of the top surface 206, in accordance with some embodiments.

In some embodiments, during the deposition process which deposits the material layer 204, some particles are formed on the top surface 206 of the material layer 204. In some embodiments, the gas flow produced on the top surface 206 would bring the particles away from the top surface 206. In some embodiments, the gas flow brings the particles away from the cleaning chamber 116 through the outlet 160. Therefore, the top surface 206 of the material layer 204 may be cleaned by the gas flow, and the quality of the semiconductor device structure 200 may be improved. In addition, in some embodiments, the yield of the process for manufacturing the semiconductor device structure 200 may also be improved.

In addition, in some embodiments, since the top surface 206 of the material layer 204 is cleaned by the gas flow without using water, the cleaning process of some embodiments of the present disclosure prevents one or more components of the material layer 204, for example Mg, from reacting with water. Therefore, the quality of the material layer 204 and the semiconductor device structure 200 may be improved.

In some embodiments, the material layer 204 has a temperature in a range from about 20° C. to about 40° C., for example, from about 25° C. to about 30° C. In some embodiments, the volatile cleaning substance 208 in a solid and/or liquid state has a temperature in a range from about −50° C. to about −220° C., for example, from about −100° C. to about −200° C. In some embodiments, the volatile cleaning substance 208 is solid nitrogen and/or liquid nitrogen, and the solid nitrogen and/or liquid nitrogen has a temperature in a range from about −150° C. to about −220° C., for example, from about −170° C. to about −210° C.

The term "about" typically means+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

In some embodiments, the volatile cleaning substance 208 in a solid and/or liquid state has a first volume, and the volatile cleaning substance 210 in gas state has a second volume. In some embodiments, the second volume is greater than the first volume.

As shown in FIG. 2B, the process for producing the gas flow further includes providing a gas 212 to the top surface 206 of the material layer 204, in accordance with some embodiments. In some embodiments, the gas 212 includes nitrogen gas, helium gas, neon gas, argon gas, clean air, or a combination thereof.

In some embodiments, the gas 212 is stored in the second container 136. During the cleaning process, the second valve 146 is opened, and the gas 212 is provided from the second container 136 to the top surface 206 of the material layer 204 through the second pipe 138 and the second nozzle 144 by the second pump 148.

However, the embodiments of the present disclosure are not limited thereto. The gas 212 may be provided onto the top surface 206 of the material layer 204 by any applicable process.

In some embodiments, the gas 212 is provided onto the top surface 206 of the material layer 204 in a direction substantially parallel to the top surface 206. However, the embodiments of the present disclosure are not limited thereto. The gas 212 may be provided onto the top surface 206 of the material layer 204 in any direction.

In some embodiments, the gas 212 may further help to bring the particles away from the top surface 206. Therefore, the cleaning efficiency of the cleaning process of some embodiments of the present disclosure is further improved by providing the gas 212, and the quality of the semiconductor device structure 200 may also be improved further. In some embodiments, the yield of the process for manufacturing the semiconductor device structure 200 may also be improved further.

In some embodiments, the gaseous cleaning substance 210 and the gas 212 together produce the gas flow on the top surface 206 of the material layer 204. However, the embodiments of the present disclosure are not limited thereto. In some other embodiments, the cleaning process of some embodiments of the present disclosure does not provide gas 212 to the top surface 206 of the material layer 204.

In some embodiments, during the cleaning process, the cleaning chamber 116 has a pressure that is less than atmospheric pressure. In some embodiments, during the cleaning process, the pressure of the cleaning chamber 116 is in a range from about 10 torr to about 100 torr, for example, from about 30 torr to about 50 torr. As shown in FIG. 2B, the pressure of the cleaning chamber 116 is controlled by the pressure control unit 150, in accordance with some embodiments.

As shown in FIG. 2B, the top surface 206 of the material layer 204 is parallel to the bottom surface 162 of the cleaning chamber 116, in accordance with some embodiments.

Figure 2C:
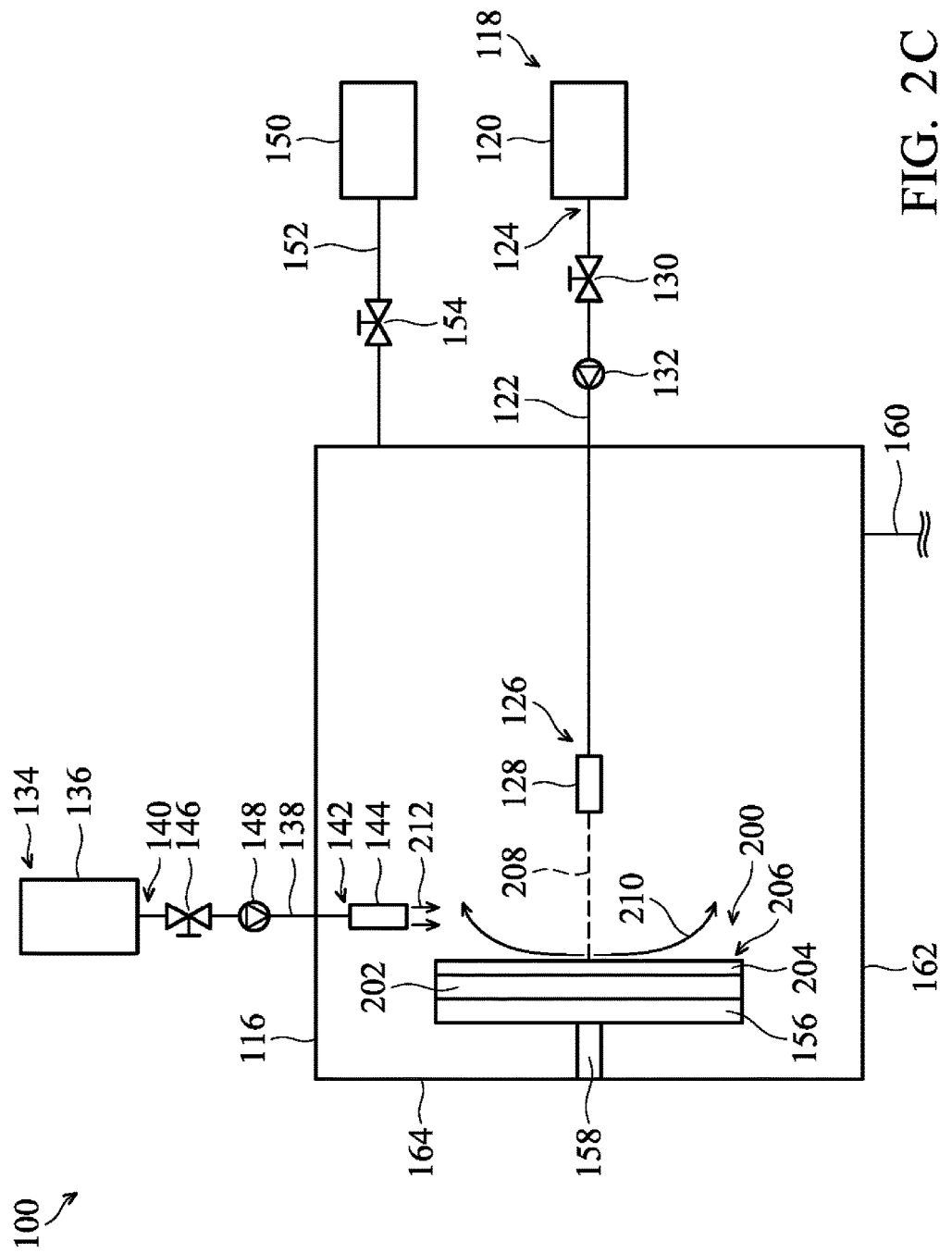
FIG. 2C is a cross-sectional view of a cleaning chamber in accordance with some other embodiments.

It should be noted that the exemplary embodiment set forth in FIGS. 2A and 2B is merely for the purpose of illustration. In addition to the embodiment set forth in FIGS. 2A and 2B, the semiconductor substrate 202 and the material layer 204 may be placed at other positions as shown in FIG. 2C. This will be described in more detail in the following description. Therefore, the present disclosure is not limited to the exemplary embodiment shown in FIGS. 2A and 2B.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

FIG. 2C is a cross-sectional view of a cleaning chamber 116 in accordance with some other embodiments. As shown in FIG. 2C, the top surface 206 of the material layer 204 is parallel to the side surface 164 of the cleaning chamber 116, in accordance with some embodiments.

The positions of the stage 156, the cleaning substance dispensing unit 118, the gas providing unit 134 and the pressure control unit 150 are not limited to that shown in FIGS. 2A-2C. The cleaning substance dispensing unit 118, the gas providing unit 134 and the pressure control unit 150 may be placed in any suitable position.

In some embodiments, a memory device structure is formed and cleaned using the process mentioned above. In some embodiments, the memory device structure includes a magnetic tunnel junction memory device structure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of some embodiments of the present disclosure and the background or the context of some embodiments of the present disclosure, and should not be interpreted in an idealized or overly formal manner unless so defined.

Figure 3A:
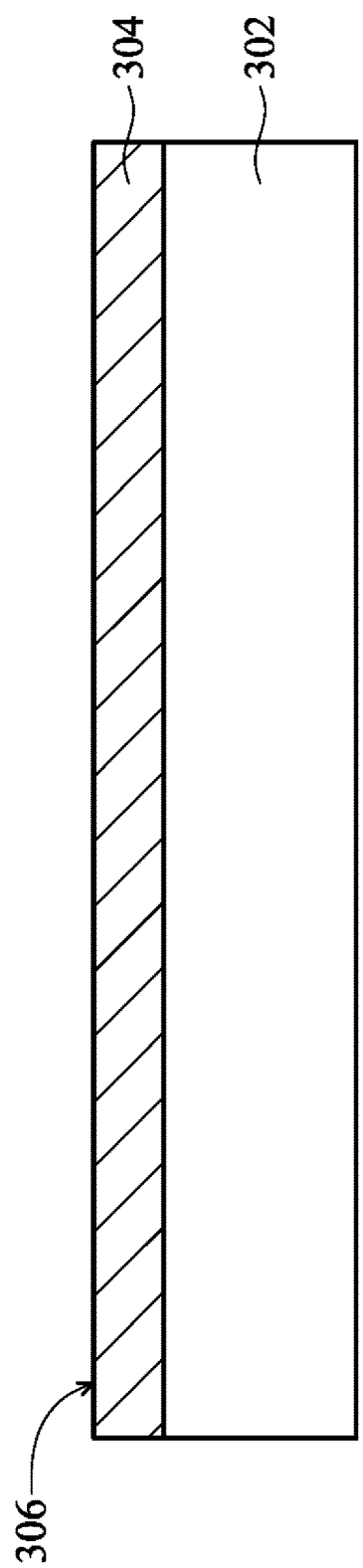
FIGS. 3A-3N are cross-sectional views of various stages of a process for forming and cleaning a semiconductor device structure, in accordance with some embodiments.
Figure 3B:
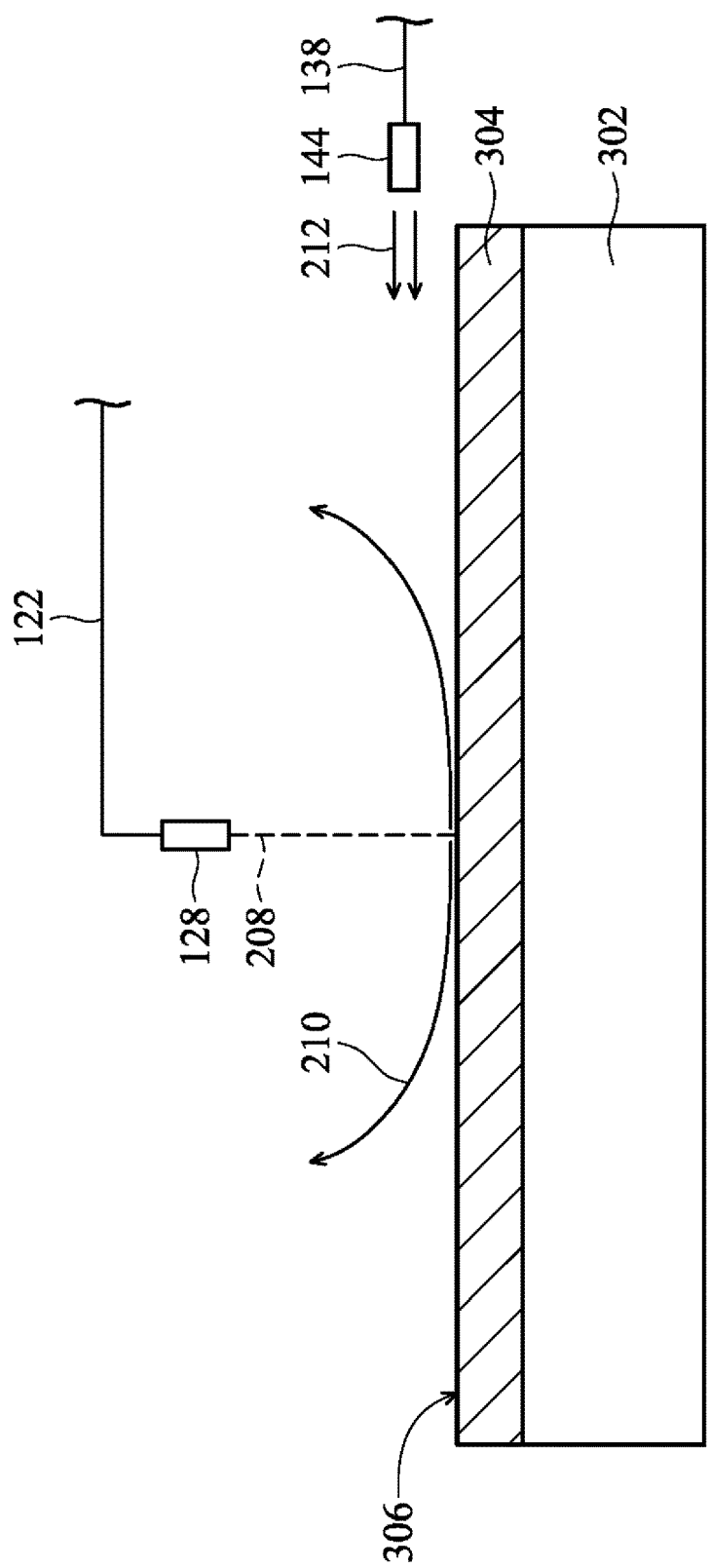
Figure 3C:
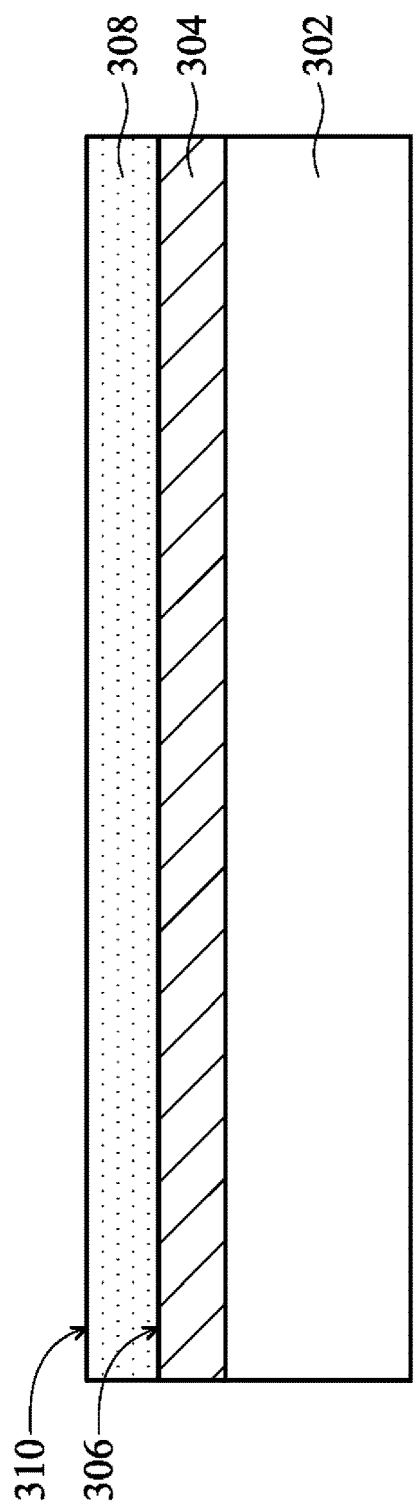
Figure 3D:
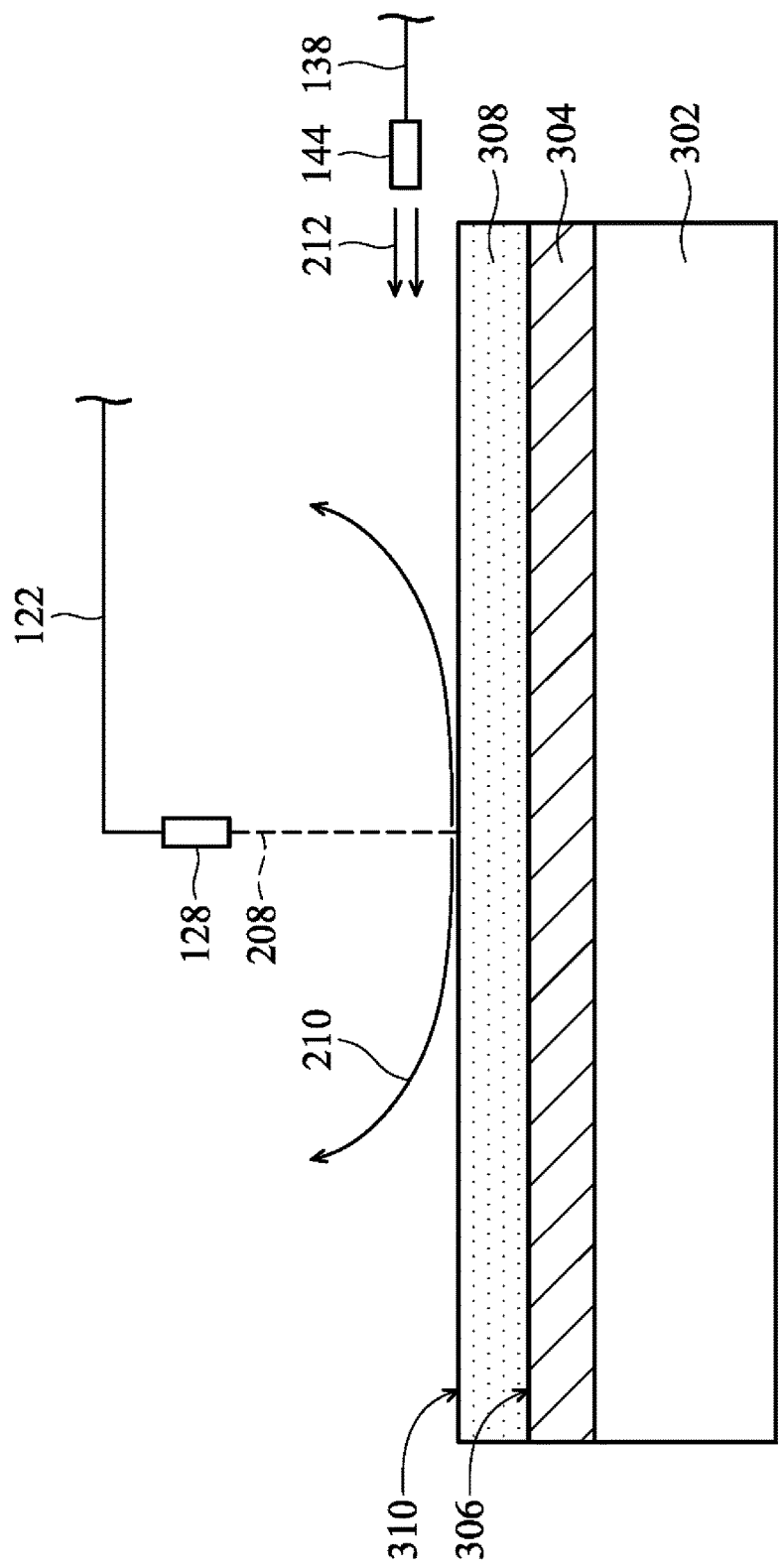
Figure 3E:
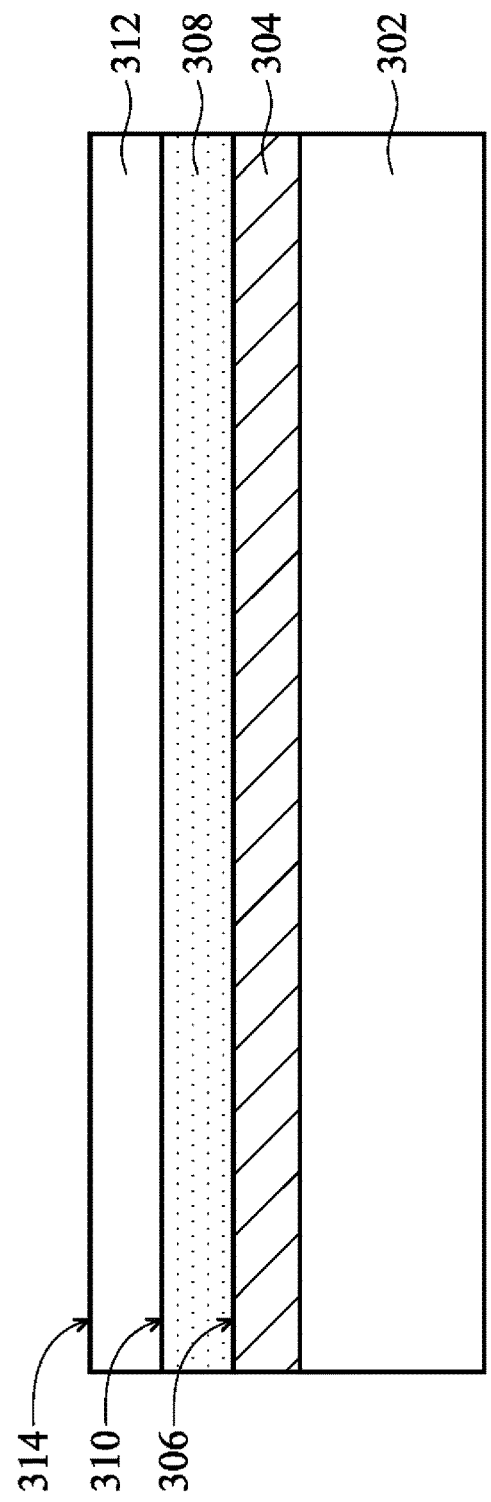
Figure 3F:
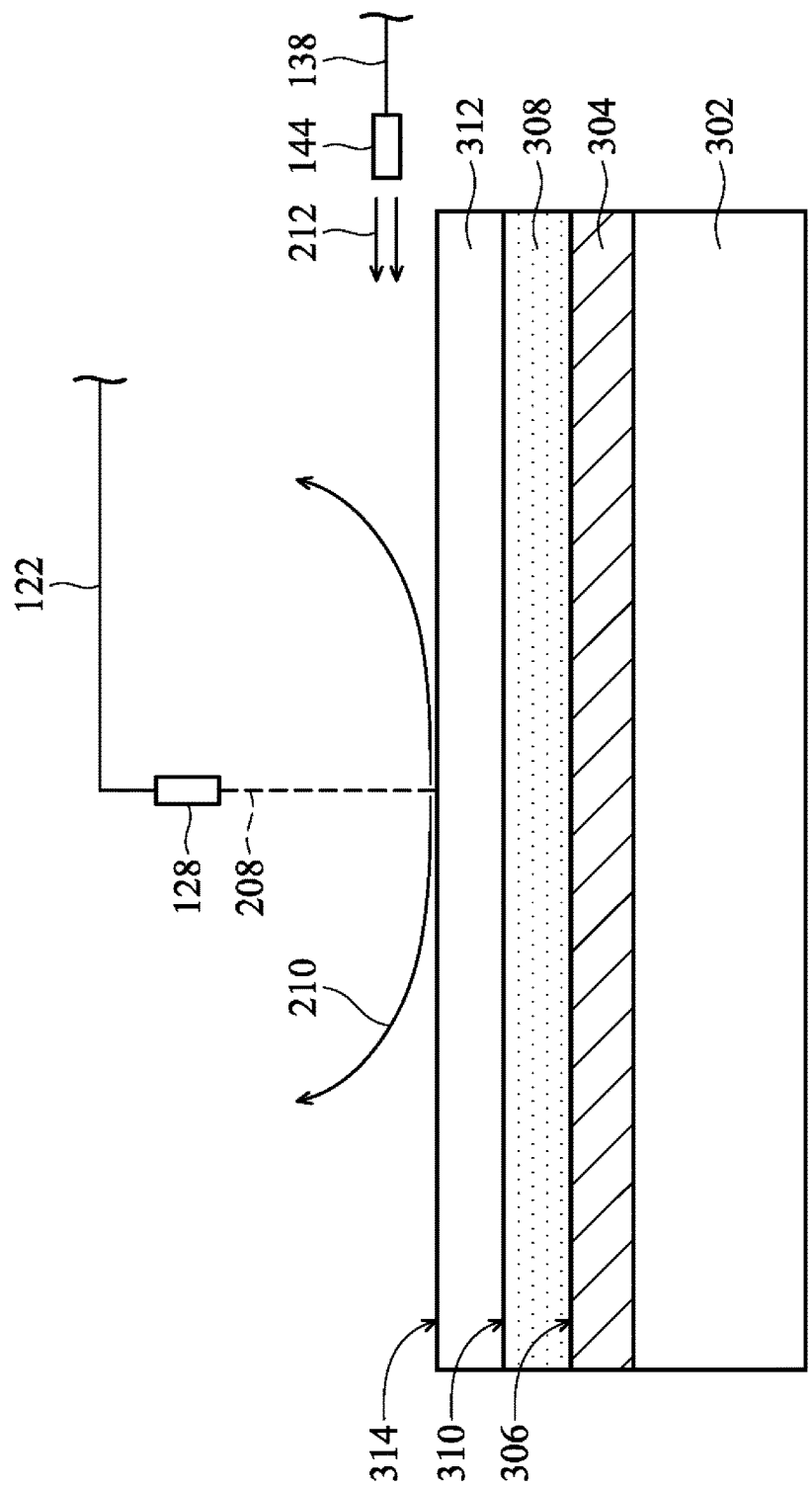
Figure 3G:
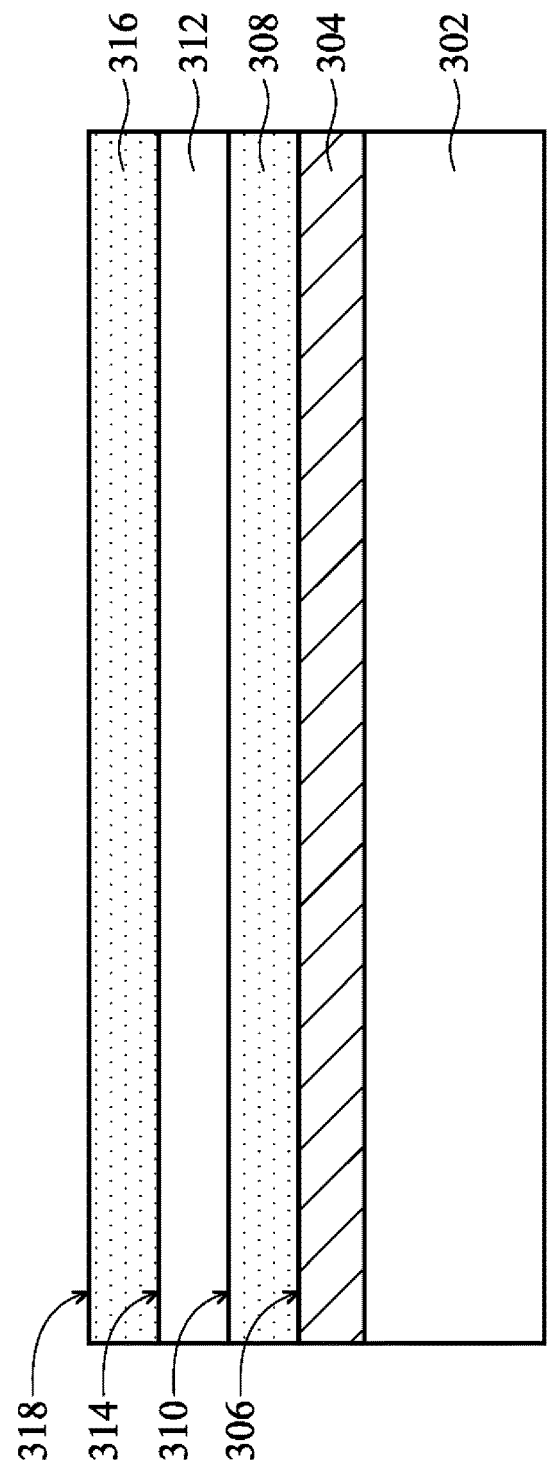
Figure 3H:
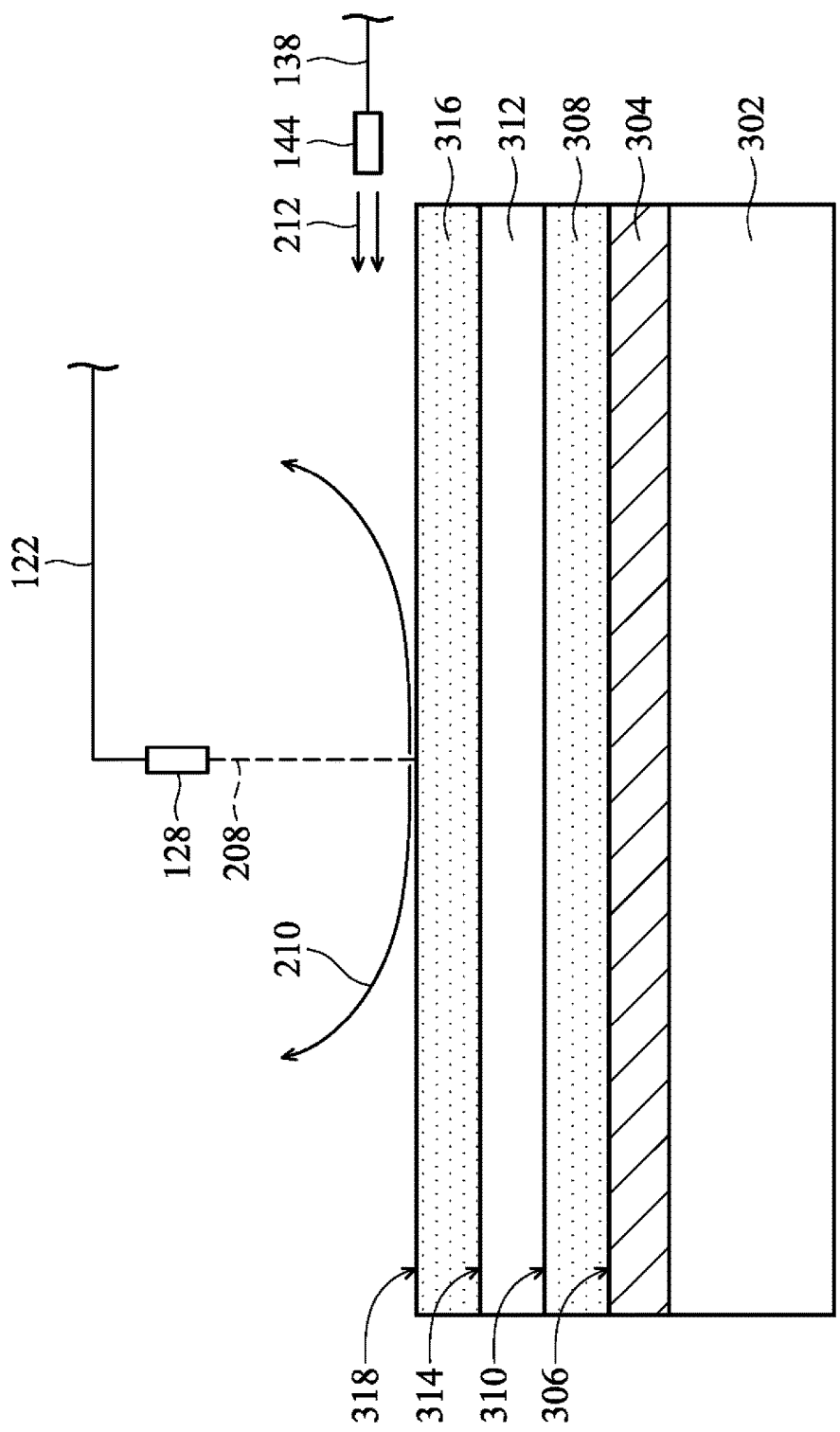
Figure 3:
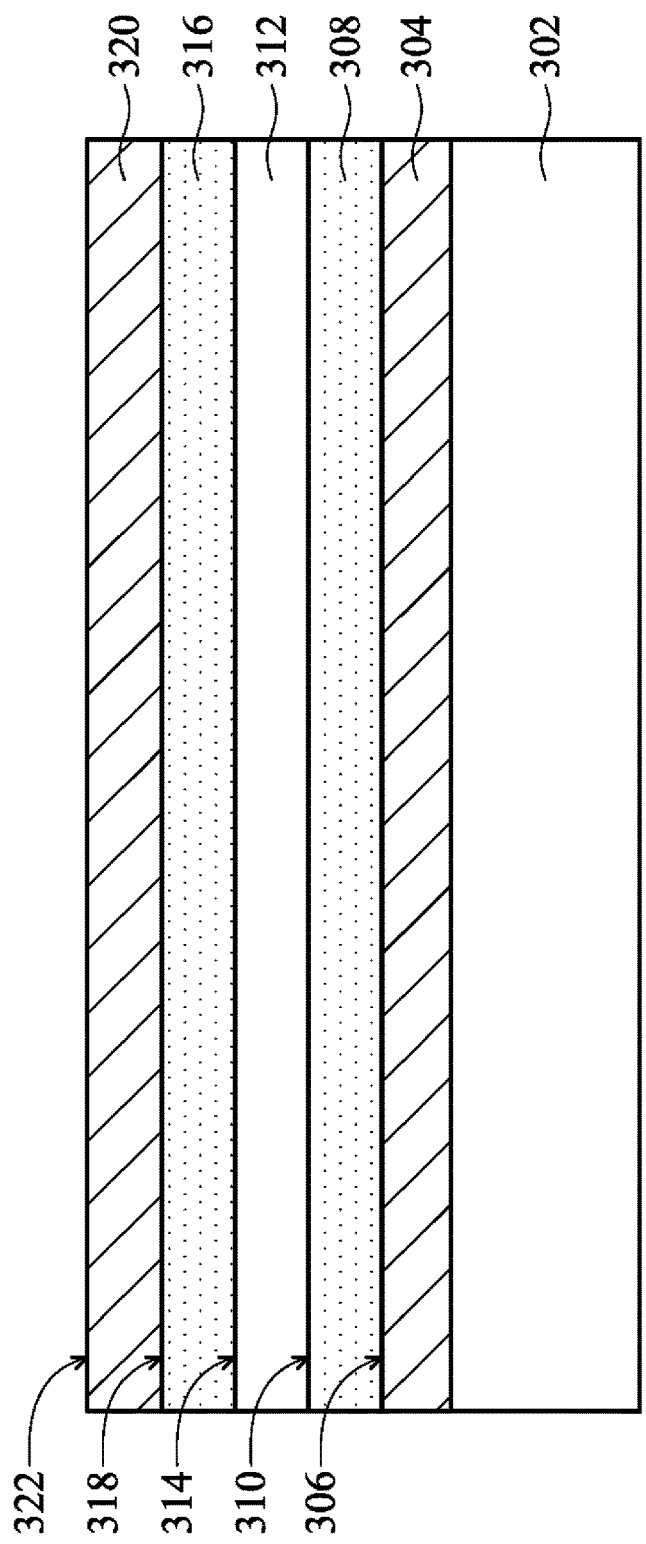
Figure 3J:
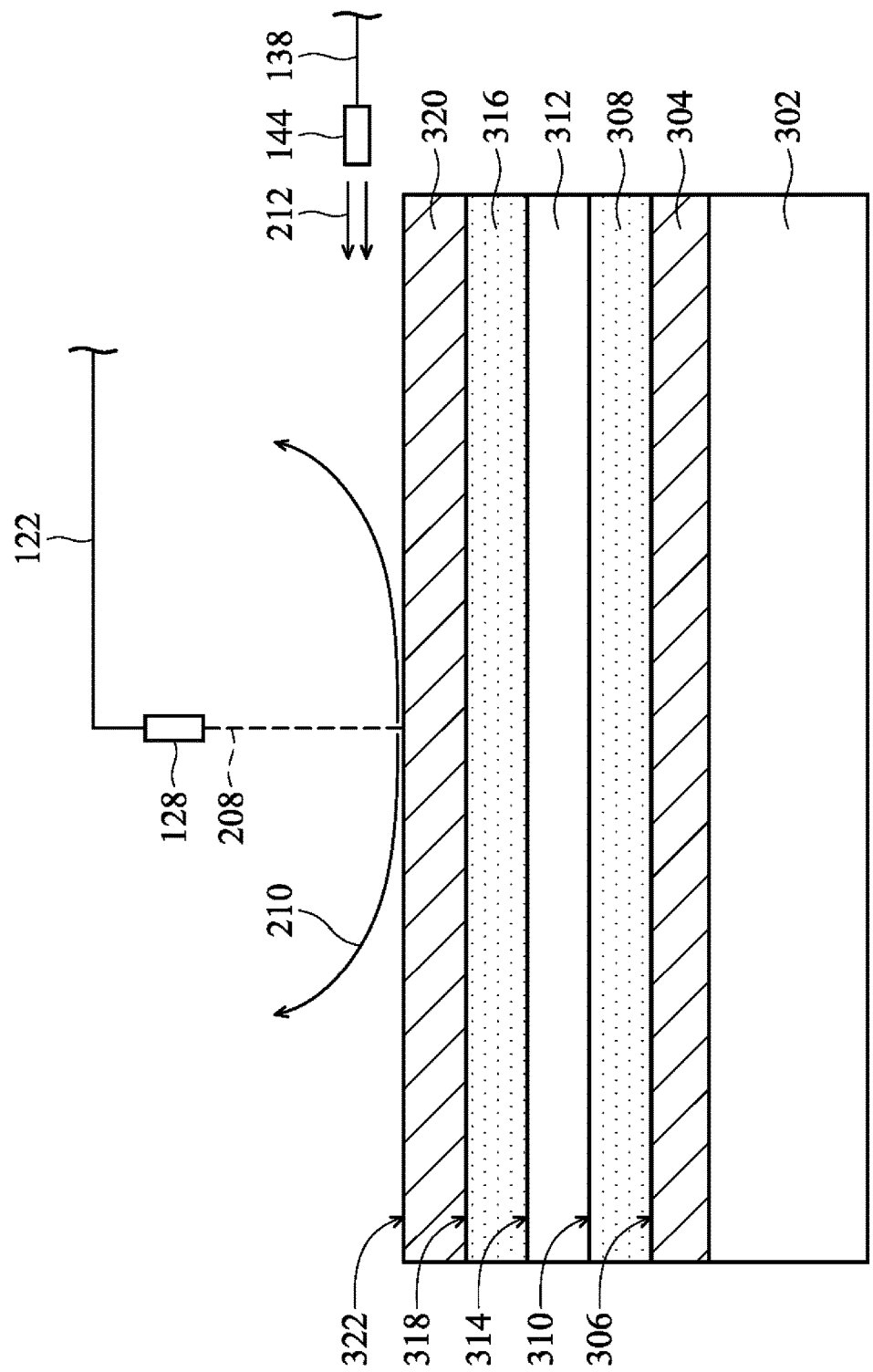
Figure 3K:
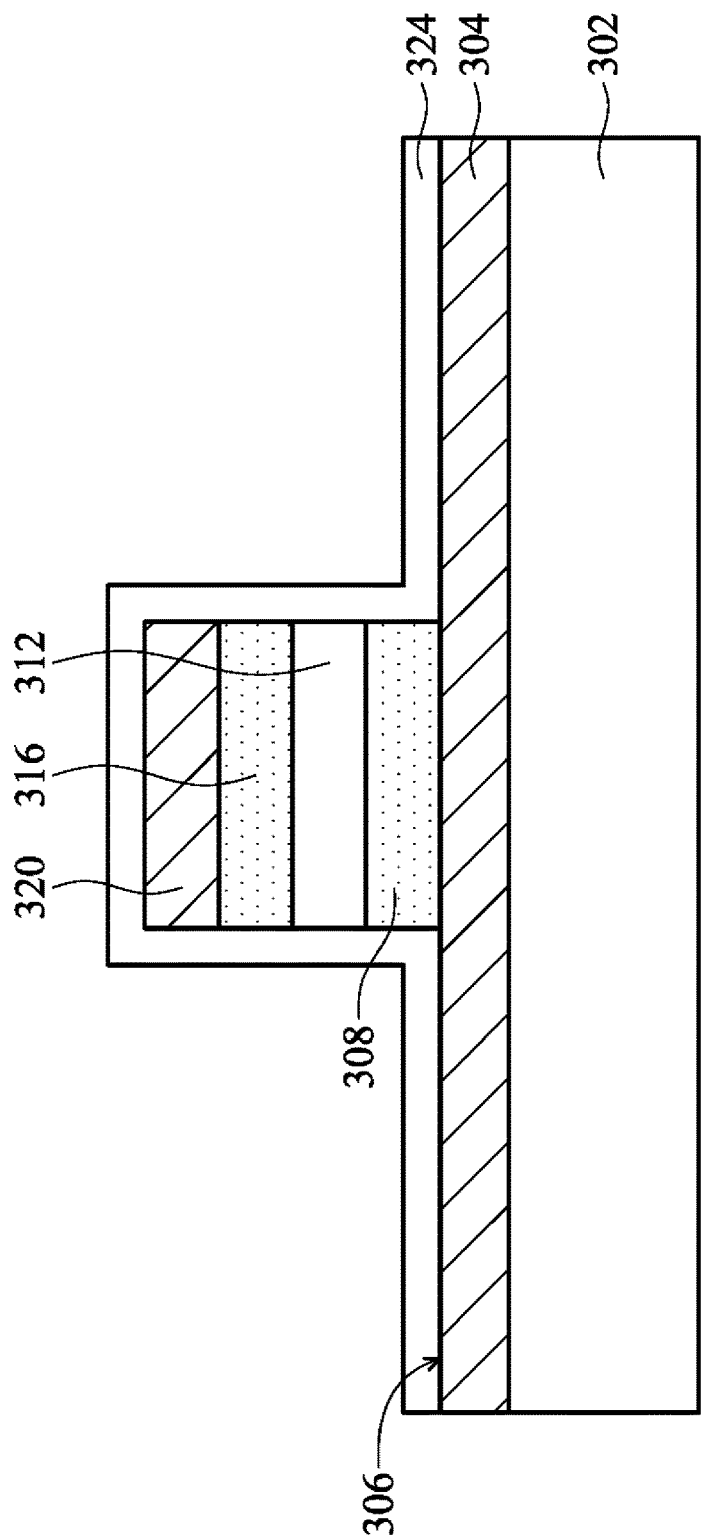
Figure 3L:
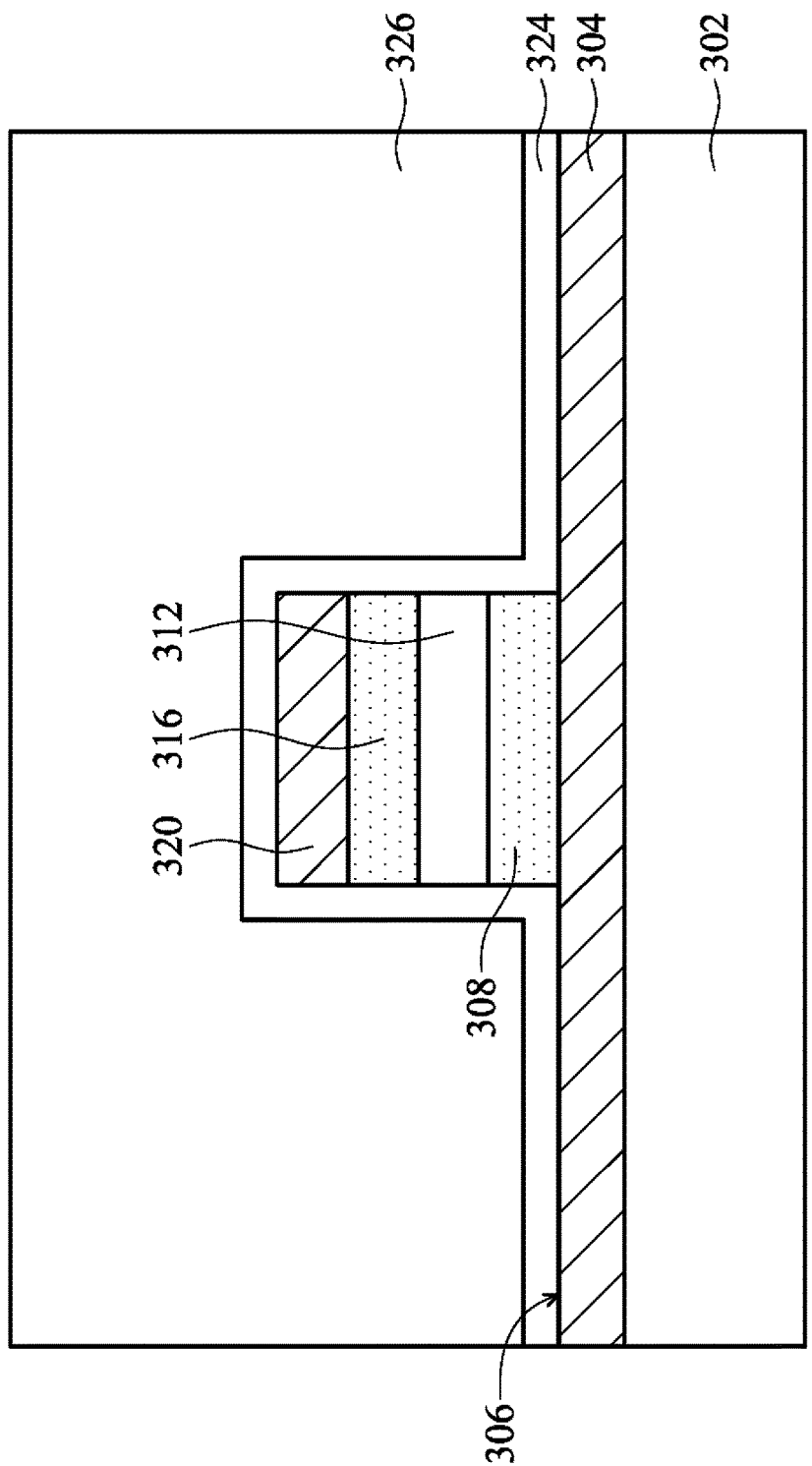
Figure 3M:
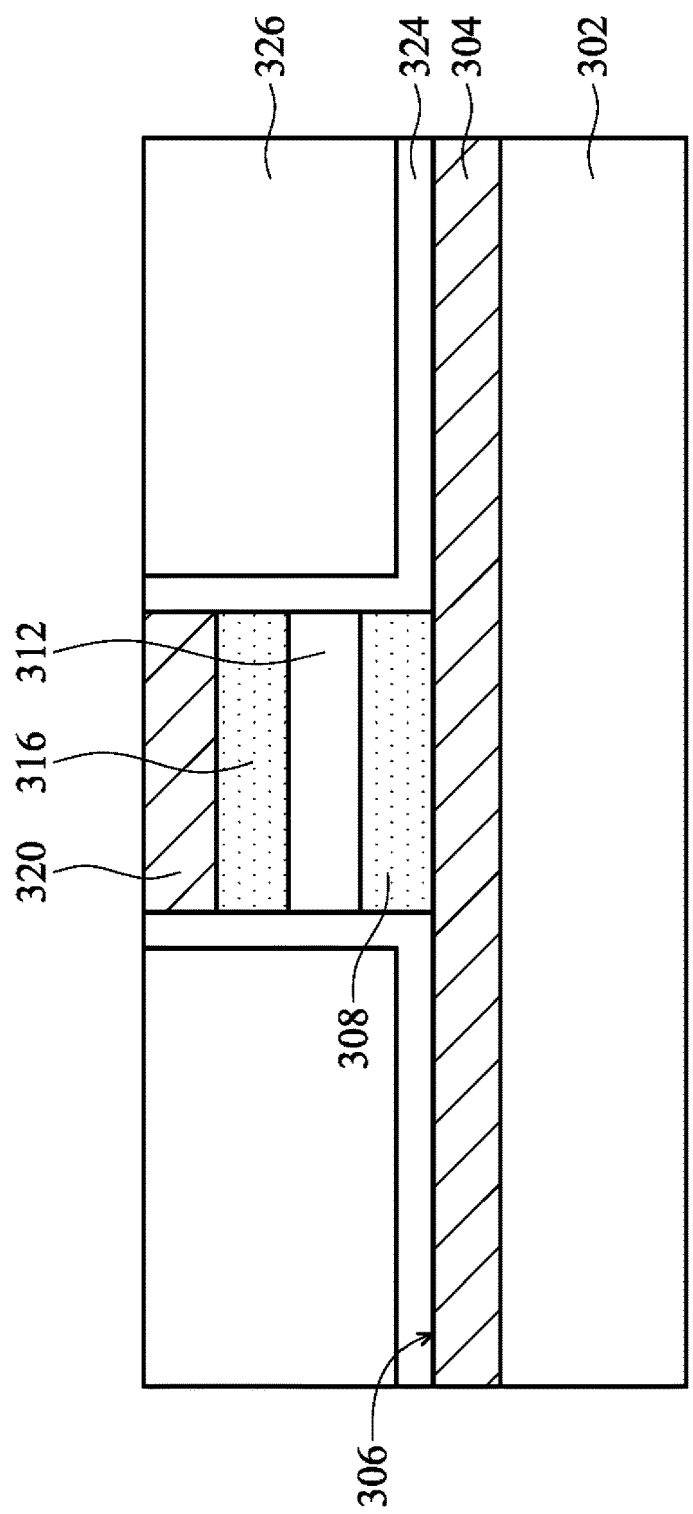
Figure 3N:
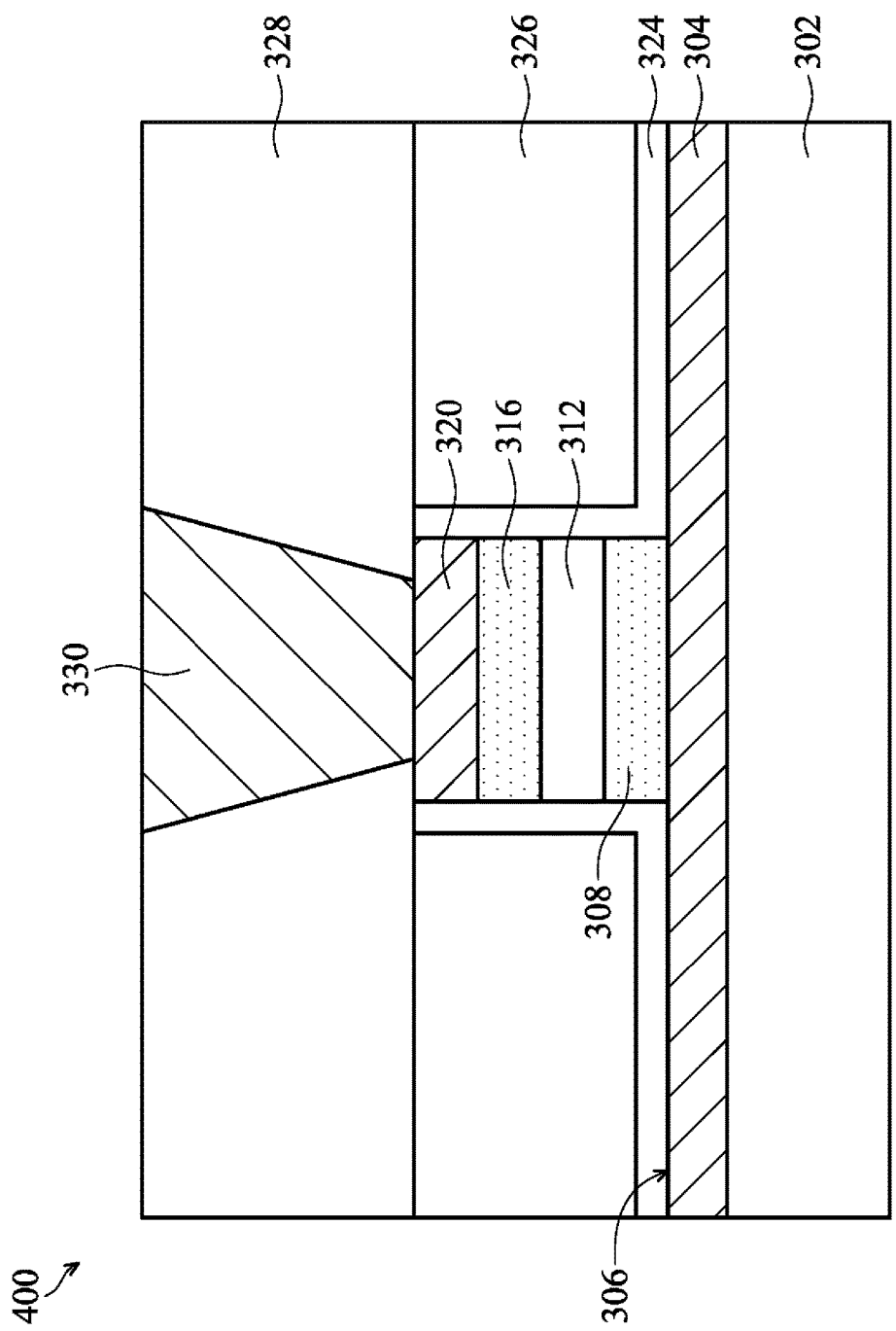

FIGS. 3A-3N are cross-sectional views of various stages of a process for forming and cleaning a semiconductor device structure, such as a memory device structure, in accordance with some embodiments.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 3A, a semiconductor substrate 302 is provided, in accordance with some embodiments. In some embodiments, the semiconductor substrate 302 is a bulk semiconductor substrate. For example, the semiconductor substrate 302 is a silicon semiconductor substrate. The semiconductor substrate 302 may include silicon or another elementary semiconductor material such as germanium. In some other embodiments, the semiconductor substrate 302 includes a compound semiconductor. The compound semiconductor may include gallium arsenide, silicon carbide, indium arsenide, indium phosphide, another suitable material, or a combination thereof.

In some embodiments, the semiconductor substrate 302 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 302 is an un-doped substrate. However, in some other embodiments, the semiconductor substrate 302 is a doped substrate such as a P-type substrate or an N-type substrate.

In some embodiments, an interconnection structure is formed in and/or over the semiconductor substrate 302. The interconnection structure also includes multiple conductive features formed in the interlayer dielectric layers. The conductive features may include conductive lines, conductive vias, and/or conductive contacts.

In some embodiments, various device elements are formed in the semiconductor substrate 302. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other applicable processes.

The device elements are interconnected through the interconnection structure in and/or over the semiconductor substrate 302 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

Afterwards, as shown in FIG. 3A, a bottom electrode layer 304 is deposited over the semiconductor substrate 302, in accordance with some embodiments. In some embodiments, the bottom electrode layer 304 has a first top surface 306.

In some embodiments, the bottom electrode layer 304 is made of copper, aluminum, tungsten, gold, chromium, nickel, platinum, titanium, iridium, rhodium, an alloy thereof, another conductive material, or a combination thereof.

In some embodiments, the semiconductor substrate 302 is placed in the first processing chamber 106 shown in FIG. 1. Afterwards, in some embodiments, the bottom electrode layer 304 is deposited over the semiconductor substrate 302 by a physical vapor deposition process. In some embodiments, the physical vapor deposition process includes a sputtering process, a resistive thermal evaporation process, an electron beam evaporation process, another applicable physical vapor deposition process, or a combination thereof.

Afterwards, in some embodiments, the semiconductor substrate 302 and the bottom electrode layer 304 are moved into the cleaning chamber 116 from the first processing chamber 106 through the transfer port 102 shown in FIG. 1.

Afterwards, as shown in FIG. 3B, the first top surface 306 of the bottom electrode layer 304 is cleaned by producing a gas flow on the first top surface 306, in accordance with some embodiments. As shown in FIG. 3B, the process for producing the gas flow includes providing a volatile cleaning substance 208 in a solid and/or liquid state onto the first top surface 306 of the bottom electrode layer 304, in accordance with some embodiments. In some embodiments, the volatile cleaning substance 208 includes nitrogen, carbon dioxide, oxygen, hydrogen, another suitable material, or a combination thereof.

In some embodiments, the temperature of the bottom electrode layer 304 is higher than the temperature of volatile cleaning substance 208 in solid state and/or liquid state. Therefore, in some embodiments, after the volatile cleaning substance 208 in a solid and/or liquid state is provided onto the first top surface 306, the volatile cleaning substance 208 in a solid and/or liquid state is converted into a cleaning substance 210 in a gaseous state to produce the gas flow to clean the first top surface 306 of the bottom electrode layer 304, in accordance with some embodiments.

In some embodiments, after the volatile cleaning substance 208 in a solid and/or liquid state touches or contacts the first top surface 306, the volatile cleaning substance 208 in a solid and/or liquid state is converted into a cleaning substance 210 in a gaseous state to produce the gas flow.

In some embodiments, the bottom electrode layer 304 has a temperature in a range from about 20° C. to about 40° C., for example, from about 25° C. to about 30° C. In some embodiments, the volatile cleaning substance 208 in a solid and/or liquid state has a temperature in a range from about −50° C. to about −220° C., for example, from about −100° C. to about −200° C. In some embodiments, the volatile cleaning substance 208 is solid nitrogen and/or liquid nitrogen, and the solid nitrogen and/or liquid nitrogen has a temperature in a range from about −150° C. to about −220° C., for example, from about −170° C. to about −210° C.

In some embodiments, the first top surface 306 of the bottom electrode layer 304 is cleaned by providing solid nitrogen and/or liquid nitrogen onto the first top surface 306. In some embodiments, after the solid nitrogen and/or liquid nitrogen is provided onto the first top surface 306, the solid nitrogen and/or liquid nitrogen is converted into nitrogen gas to produce the gas flow to clean the first top surface 306 of the bottom electrode layer 304, in accordance with some embodiments.

As shown in FIG. 3B, the gaseous cleaning substance 210 flows away from the first top surface 306 of the bottom electrode layer 304, in accordance with some embodiments. Therefore, in some embodiments, the gas flow produced on the first top surface 306 would bring the particles on the first top surface 306 away from the first top surface 306. Therefore, the first top surface 306 of the bottom electrode layer 304 may be cleaned by the gas flow produced by the gaseous cleaning substance 210, and the quality of the semiconductor device structure may be improved. In addition, in some embodiments, the yield of the process for manufacturing the semiconductor device structure may also be improved.

As shown in FIG. 3B, during the cleaning process which cleans the first top surface 306, the process for producing the gas flow further includes providing a gas 212 to the first top surface 306 of the bottom electrode layer 304, in accordance with some embodiments. In some embodiments, the gas 212 includes nitrogen gas, helium gas, neon gas, argon gas, clean air, or a combination thereof.

In some embodiments, the gas 212 may further help to bring the particles away from the first top surface 306. Therefore, the cleaning efficiency of the cleaning process of some embodiments of the present disclosure is further improved by providing the gas 212, and the quality of the semiconductor device structure may also be improved further. In some embodiments, the yield of the process for manufacturing the semiconductor device structure may also be improved further.

In some embodiments, the gaseous cleaning substance 210 and the gas 212 together produce the gas flow on the first top surface 306 of the bottom electrode layer 304. However, the embodiments of the present disclosure are not limited thereto. In some other embodiments, the cleaning process of some embodiments of the present disclosure does not provide gas 212 to the first top surface 306 of the bottom electrode layer 304.

In some embodiments, the stage 156 is able to heat the semiconductor substrate 302 and the layer(s) formed thereon. In some embodiments, during the cleaning process which cleans the first top surface 306 of the bottom electrode layer 304 or other layers formed in the subsequent processes, the semiconductor substrate 302, the bottom electrode layer 304 and/or other layers are heated by the stage 156, and the temperature of the bottom electrode layer 304 is kept in a range from about 20° C. to about 40° C., for example, from about 25° C. to about 30° C.

However, the embodiments of the present disclosure are not limited thereto. In some other embodiments, the semiconductor substrate 302 and the layer(s) formed thereon are not heated during the cleaning process.

In some embodiments, after the cleaning process which cleans the first top surface 306 of the bottom electrode layer 304, the semiconductor substrate 302 and the bottom electrode layer 304 are placed in the cleaning chamber 116 until the temperature of the bottom electrode layer 304 is substantially the same as the temperature in the transfer port 102. In some embodiments, the bottom electrode layer 304 is heated by the stage 156 to let the temperature of the bottom electrode layer 304 be substantially the same as the temperature in the transfer port 102.

Within the context of this specification, the word "substantially" means preferably at least 90%, more preferably 95%, even more preferably 98%, most preferably 99%.

In some embodiments, after the temperature of the bottom electrode layer 304 is substantially the same as the temperature in the transfer port 102, the semiconductor substrate 302 and the bottom electrode layer 304 are moved out of the cleaning chamber 116 and moved into the second processing chamber 108 through the transfer port 102.

In some embodiments, since the semiconductor substrate 302 and the bottom electrode layer 304 are moved out of the cleaning chamber 116 after the temperature of the bottom electrode layer 304 becomes substantially the same as the temperature in the transfer port 102, the formation of water on the first top surface 306 of the bottom electrode layer 304 is prevented. Therefore, the quality of the semiconductor device structure may be improved.

However, the embodiments of the present disclosure are not limited thereto. In some other embodiments, the semiconductor substrate 302 and the bottom electrode layer 304 are moved out of the cleaning chamber 116 and moved into the second processing chamber 108 without having the temperature of the bottom electrode layer 304 become substantially the same as the temperature in the transfer port 102.

Afterwards, as shown in FIG. 3C, a first magnetic material layer 308 is deposited over the first top surface 306 of the bottom electrode layer 304, in accordance with some embodiments. In some embodiments, the first magnetic material layer 308 has a second top surface 310.

In some embodiments, the first magnetic material layer 308 is made of platinum magnesium (PtMn), another conductive material, or a combination thereof.

In some embodiments, the bottom electrode layer 304 is placed in the second processing chamber 108 shown in FIG. 1. Afterwards, in some embodiments, the first magnetic material layer 308 is deposited over the bottom electrode layer 304 by a physical vapor deposition process. In some embodiments, the physical vapor deposition process includes a sputtering process, a resistive thermal evaporation process, an electron beam evaporation process, another applicable physical vapor deposition process, or a combination thereof.

Afterwards, in some embodiments, the semiconductor substrate 302, the bottom electrode layer 304 and the first magnetic material layer 308 are moved into the cleaning chamber 116 from the second processing chamber 108 through the transfer port 102 shown in FIG. 1.

Afterwards, as shown in FIG. 3D, the second top surface 310 of the first magnetic material layer 308 is cleaned by producing a gas flow on the second top surface 310, in accordance with some embodiments. As shown in FIG. 3D, the process for producing the gas flow includes providing a volatile cleaning substance 208 in a solid and/or liquid state onto the second top surface 310 of the first magnetic material layer 308, in accordance with some embodiments. In some embodiments, the volatile cleaning substance 208 includes nitrogen, carbon dioxide, oxygen, hydrogen, another suitable material, or a combination thereof.

In some embodiments, the temperature of the first magnetic material layer 308 is higher than the temperature of volatile cleaning substance 208 in solid state and/or liquid state. Therefore, in some embodiments, after the volatile cleaning substance 208 in a solid and/or liquid state is provided onto the second top surface 310, the volatile cleaning substance 208 in a solid and/or liquid state is converted into a cleaning substance 210 in a gaseous state to produce the gas flow to clean the second top surface 310 of the first magnetic material layer 308, in accordance with some embodiments.

In some embodiments, the second top surface 310 of the first magnetic material layer 308 is cleaned by providing solid nitrogen and/or liquid nitrogen onto the second top surface 310. In some embodiments, after the solid nitrogen and/or liquid nitrogen is provided onto the second top surface 310, the solid nitrogen and/or liquid nitrogen is converted into nitrogen gas to produce the gas flow to clean the second top surface 310 of the first magnetic material layer 308, in accordance with some embodiments.

In some embodiments, the first magnetic material layer 308 has a temperature in a range from about 20° C. to about 40° C., for example, from about 25° C. to about 30° C.

In some embodiments, the gas flow produced on the second top surface 310 would remove the particles from the second top surface 310. Therefore, the second top surface 310 of the first magnetic material layer 308 may be cleaned by the gas flow produced by the gaseous cleaning substance 210.

As shown in FIG. 3D, during the cleaning process which cleans the second top surface 310, the process for producing the gas flow further includes providing a gas 212 to the second top surface 310 of the first magnetic material layer 308, in accordance with some embodiments. In some embodiments, the gas 212 includes nitrogen gas, helium gas, neon gas, argon gas, clean air, or a combination thereof.

In some embodiments, the gas 212 may further help to bring the particles away from the second top surface 310. Therefore, the cleaning efficiency of the cleaning process of some embodiments of the present disclosure is further improved by providing the gas 212.

In some embodiments, the gaseous cleaning substance 210 and the gas 212 together produce the gas flow on the second top surface 310 of the first magnetic material layer 308. However, the embodiments of the present disclosure are not limited thereto. In some other embodiments, the cleaning process of some embodiments of the present disclosure does not provide gas 212 to the second top surface 310 of the first magnetic material layer 308.

In some embodiments, after the cleaning process which cleans the second top surface 310 of the first magnetic material layer 308, the semiconductor substrate 302, the bottom electrode layer 304 and the first magnetic material layer 308 are placed in the cleaning chamber 116 until the temperatures of the semiconductor substrate 302, the bottom electrode layer 304 and the first magnetic material layer 308 are substantially the same as the temperature in the transfer port 102.

In some embodiments, after the temperatures of the semiconductor substrate 302, the bottom electrode layer 304 and the first magnetic material layer 308 are substantially the same as the temperature in the transfer port 102, the semiconductor substrate 302, the bottom electrode layer 304 and the first magnetic material layer 308 are moved out of the cleaning chamber 116 and moved into the third processing chamber 110 through the transfer port 102.

However, the embodiments of the present disclosure are not limited thereto. In some other embodiments, the semiconductor substrate 302, the bottom electrode layer 304 and the first magnetic material layer 308 are moved out of the cleaning chamber 116 and moved into the third processing chamber 110 without having the temperatures of the semiconductor substrate 302, the bottom electrode layer 304 and the first magnetic material layer 308 become substantially the same as the temperature in the transfer port 102.

Afterwards, as shown in FIG. 3E, a tunnel barrier layer 312 is deposited over the second top surface 310 of the first magnetic material layer 308, in accordance with some embodiments. In some embodiments, the tunnel barrier layer 312 has a third top surface 314.

In some embodiments, the tunnel barrier layer 312 is made of magnesium oxide (MgO), another conductive material, or a combination thereof.

In some embodiments, the first magnetic material layer 308 is placed in the third processing chamber 110 shown in FIG. 1. Afterwards, in some embodiments, the tunnel barrier layer 312 is deposited over the first magnetic material layer 308 by a physical vapor deposition process. In some embodiments, the physical vapor deposition process includes a sputtering process, a resistive thermal evaporation process, an electron beam evaporation process, another applicable physical vapor deposition process, or a combination thereof.

Afterwards, in some embodiments, the semiconductor substrate 302, the bottom electrode layer 304, the first magnetic material layer 308 and the tunnel barrier layer 312 are moved into the cleaning chamber 116 from the third processing chamber 110 through the transfer port 102 shown in FIG. 1.

Afterwards, as shown in FIG. 3F, the third top surface 314 of the tunnel barrier layer 312 is cleaned by producing a gas flow on the third top surface 314, in accordance with some embodiments. As shown in FIG. 3F, the process for producing the gas flow includes providing a volatile cleaning substance 208 in a solid and/or liquid state onto the third top surface 314 of the tunnel barrier layer 312, in accordance with some embodiments. In some embodiments, after the volatile cleaning substance 208 in a solid and/or liquid state is provided onto the third top surface 314, the volatile cleaning substance 208 in a solid and/or liquid state is converted into a cleaning substance 210 in a gaseous state to produce the gas flow.

In some embodiments, the third top surface 314 of the tunnel barrier layer 312 is cleaned by providing solid nitrogen and/or liquid nitrogen onto the third top surface 314. In some embodiments, after the solid nitrogen and/or liquid nitrogen is provided onto the third top surface 314, the solid nitrogen and/or liquid nitrogen is converted into nitrogen gas to produce the gas flow to clean the third top surface 314 of the tunnel barrier layer 312, in accordance with some embodiments. In some embodiments, the tunnel barrier layer 312 has a temperature in a range from about 20° C. to about 40° C., for example, from about 25° C. to about 30° C.

As shown in FIG. 3F, during the cleaning process which cleans the third top surface 314, the process for producing the gas flow further includes providing a gas 212 to the third top surface 314 of the tunnel barrier layer 312, in accordance with some embodiments. In some embodiments, the gas 212 includes nitrogen gas, helium gas, neon gas, argon gas, clean air, or a combination thereof.

In some embodiments, the gaseous cleaning substance 210 and the gas 212 together produce the gas flow on the third top surface 314 of the tunnel barrier layer 312. However, the embodiments of the present disclosure are not limited thereto. In some other embodiments, the cleaning process of some embodiments of the present disclosure does not provide gas 212 to the third top surface 314 of the tunnel barrier layer 312.

In some embodiments, since the third top surface 314 of the tunnel barrier layer 312 is cleaned by the gas flow without using water, the cleaning process of some embodiments of the present disclosure prevents one or more components of the material of the tunnel barrier layer 312, for example Mg, from reacting with water. Therefore, the quality of the tunnel barrier layer 312 and the semiconductor device structure may be improved.

In some embodiments, after the cleaning process, the semiconductor substrate 302, the bottom electrode layer 304, the first magnetic material layer 308 and the tunnel barrier layer 312 are moved out of the cleaning chamber 116 and moved into the fourth processing chamber 112 through the transfer port 102 with or without having the temperatures of the semiconductor substrate 302, the bottom electrode layer 304, the first magnetic material layer 308 and the tunnel barrier layer 312 become substantially the same as the temperature in the transfer port 102.

Afterwards, as shown in FIG. 3G, a second magnetic material layer 316 is deposited over the third top surface 314 of the tunnel barrier layer 312, in accordance with some embodiments. In some embodiments, the second magnetic material layer 316 has a fourth top surface 318.

In some embodiments, the second magnetic material layer 316 is made of cobalt (Co)-iron (Fe) containing material such as cobalt iron alloy (CoFe) or cobalt iron boron (CoFeB), another conductive material, or a combination thereof.

In some embodiments, the semiconductor substrate 302, the bottom electrode layer 304, the first magnetic material layer 308 and the tunnel barrier layer 312 are placed in the fourth processing chamber 112 shown in FIG. 1. Afterwards, in some embodiments, the second magnetic material layer 316 is deposited over the tunnel barrier layer 312 by a physical vapor deposition process. In some embodiments, the physical vapor deposition process includes a sputtering process, a resistive thermal evaporation process, an electron beam evaporation process, another applicable physical vapor deposition process, or a combination thereof.

Afterwards, in some embodiments, the semiconductor substrate 302, the bottom electrode layer 304, the first magnetic material layer 308, the tunnel barrier layer 312 and the second magnetic material layer 316 are moved into the cleaning chamber 116 from the fourth processing chamber 112 through the transfer port 102 shown in FIG. 1.

Afterwards, as shown in FIG. 3H, the fourth top surface 318 of the second magnetic material layer 316 is cleaned by producing a gas flow on the fourth top surface 318, in accordance with some embodiments. As shown in FIG. 3H, the process for producing the gas flow includes providing a volatile cleaning substance 208 in a solid and/or liquid state onto the fourth top surface 318 of the second magnetic material layer 316, in accordance with some embodiments. In some embodiments, after the volatile cleaning substance 208 in a solid and/or liquid state is provided onto the fourth top surface 318, the volatile cleaning substance 208 in a solid and/or liquid state is converted into a cleaning substance 210 in a gaseous state to produce the gas flow.

In some embodiments, the fourth top surface 318 of the second magnetic material layer 316 is cleaned by providing solid nitrogen and/or liquid nitrogen onto the fourth top surface 318. In some embodiments, after the solid nitrogen and/or liquid nitrogen is provided onto the fourth top surface 318, the solid nitrogen and/or liquid nitrogen is converted into nitrogen gas to produce the gas flow to clean the fourth top surface 318 of the second magnetic material layer 316, in accordance with some embodiments. In some embodiments, the second magnetic material layer 316 has a temperature in a range from about 20° C. to about 40° C., for example, from about 25° C. to about 30° C.

As shown in FIG. 3H, during the cleaning process which cleans the fourth top surface 318, the process for producing the gas flow further includes providing a gas 212 to the fourth top surface 318 of the second magnetic material layer 316, in accordance with some embodiments. In some embodiments, the gas 212 includes nitrogen gas, helium gas, neon gas, argon gas, clean air, or a combination thereof.

In some embodiments, the gaseous cleaning substance 210 and the gas 212 together produce the gas flow on the fourth top surface 318 of the second magnetic material layer 316. However, the embodiments of the present disclosure are not limited thereto. In some other embodiments, the cleaning process of some embodiments of the present disclosure does not provide gas 212 to the fourth top surface 318 of the second magnetic material layer 316.

In some embodiments, after the cleaning process, the semiconductor substrate 302, the bottom electrode layer 304, the first magnetic material layer 308, the tunnel barrier layer 312 and the second magnetic material layer 316 are moved out of the cleaning chamber 116 and moved into the fourth processing chamber 112 through the transfer port 102 with or without having the temperatures of the semiconductor substrate 302, the bottom electrode layer 304, the first magnetic material layer 308, the tunnel barrier layer 312 and the second magnetic material layer 316 become substantially the same as the temperature in the transfer port 102.

Afterwards, as shown in FIG. 3I, a top electrode layer 320 is deposited over the fourth top surface 318 of the second magnetic material layer 316, in accordance with some embodiments. In some embodiments, the top electrode layer 320 has a fifth top surface 322.

In some embodiments, the top electrode layer 320 is made of copper, aluminum, tungsten, gold, chromium, nickel, platinum, titanium, iridium, rhodium, an alloy thereof, another conductive material, or a combination thereof.

In some embodiments, the semiconductor substrate 302, the bottom electrode layer 304, the first magnetic material layer 308, the tunnel barrier layer 312 and the second magnetic material layer 316 are placed in the fifth processing chamber 114 shown in FIG. 1. Afterwards, in some embodiments, the top electrode layer 320 is deposited over the fourth top surface 318 of the second magnetic material layer 316 by a physical vapor deposition process. In some embodiments, the physical vapor deposition process includes a sputtering process, a resistive thermal evaporation process, an electron beam evaporation process, another applicable physical vapor deposition process, or a combination thereof.

Afterwards, in some embodiments, the semiconductor substrate 302, the bottom electrode layer 304, the first magnetic material layer 308, the tunnel barrier layer 312, the second magnetic material layer 316 and the top electrode layer 320 are moved into the cleaning chamber 116 from the fifth processing chamber 114 through the transfer port 102 shown in FIG. 1.

Afterwards, as shown in FIG. 3J, the fifth top surface 322 of the top electrode layer 320 is cleaned by producing a gas flow on the fifth top surface 322, in accordance with some embodiments. As shown in FIG. 3J, the process for producing the gas flow includes providing a volatile cleaning substance 208 in a solid and/or liquid state onto the fifth top surface 322 of the top electrode layer 320, in accordance with some embodiments. In some embodiments, after the volatile cleaning substance 208 in a solid and/or liquid state is provided onto the fifth top surface 322, the volatile cleaning substance 208 in a solid and/or liquid state is converted into a cleaning substance 210 in a gaseous state to produce the gas flow.

In some embodiments, the fifth top surface 322 of the top electrode layer 320 is cleaned by providing solid nitrogen and/or liquid nitrogen onto the fifth top surface 322. In some embodiments, after the solid nitrogen and/or liquid nitrogen is provided onto the fifth top surface 322, the solid nitrogen and/or liquid nitrogen is converted into nitrogen gas to produce the gas flow to clean the fifth top surface 322 of the top electrode layer 320, in accordance with some embodiments. In some embodiments, the top electrode layer 320 has a temperature in a range from about 20° C. to about 40° C., for example, from about 25° C. to about 30° C.

As shown in FIG. 3J, during the cleaning process which cleans the fifth top surface 322, the process for producing the gas flow further includes providing a gas 212 to the fifth top surface 322 of the top electrode layer 320, in accordance with some embodiments. In some embodiments, the gas 212 includes nitrogen gas, helium gas, neon gas, argon gas, clean air, or a combination thereof.

In some embodiments, the gaseous cleaning substance 210 and the gas 212 together produce the gas flow on the fifth top surface 322 of the top electrode layer 320. However, the embodiments of the present disclosure are not limited thereto. In some other embodiments, the cleaning process of some embodiments of the present disclosure does not provide gas 212 to the fifth top surface 322 of the top electrode layer 320.

In some embodiments, after the cleaning process, the semiconductor substrate 302, the bottom electrode layer 304, the first magnetic material layer 308, the tunnel barrier layer 312, the second magnetic material layer 316 and the top electrode layer 320 are moved to other chamber or other apparatus (not shown in this figure) to proceed to the following processes with or without having the temperatures of the semiconductor substrate 302, the bottom electrode layer 304, the first magnetic material layer 308, the tunnel barrier layer 312, the second magnetic material layer 316 and the top electrode layer 320 become substantially the same as the temperature in the transfer port 102.

Afterwards, as shown in FIG. 3K, the top electrode layer 320, the second magnetic material layer 316, the tunnel barrier layer 312 and the first magnetic material layer 308 are patterned by a photolithography process and an etching process, in accordance with some embodiments. In some embodiments, the etching process includes a dry etching process, a wet etching process, a plasma etching process, or a combination thereof.

In some embodiments, the patterned first magnetic material layer 308, patterned tunnel barrier layer 312 and patterned second magnetic material layer 316 are together referred to as a magnetic tunnel junction stack.

Afterwards, as shown in FIG. 3K, a spacer layer 324 is conformally deposited over the magnetic tunnel junction stack and the bottom electrode layer 304, in accordance with some embodiments.

In some embodiments, the spacer layer 324 is made of silicon nitride, silicon oxynitride, silicon carbide, another suitable material, or a combination thereof. The spacer layer 324 may be deposited using a CVD (chemical vapor deposition) process, a PVD process, a spin-on coating process, another applicable process, or a combination thereof.

Afterwards, as shown in FIG. 3L, a first dielectric layer 326 is formed to blanketly surround and cover the spacer layer 324, the magnetic tunnel junction stack and the bottom electrode layer 304, in accordance with some embodiments. In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, as shown in FIG. 3M, a planarization process is performed to thin down and partially remove the first dielectric layer 326 and the spacer layer 324. The first dielectric layer 326 and the spacer layer 324 may be partially removed until the top electrode layer 320 is exposed. In some embodiments, the planarization process includes a CMP process, a grinding process, a dry polishing process, an etching process, another applicable process, or a combination thereof.

Afterwards, as shown in FIG. 3N, a second dielectric layer 328 is subsequently formed to cover the first dielectric layer 326 and the top electrode layer 320, in accordance with some embodiments. In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, as shown in FIG. 3N, a contact 330 is formed in the second dielectric layer 328 to form the memory device structure 400. As shown in FIG. 3N, the contact 330 is electrically connected to the top electrode layer 320, in accordance with some embodiments. As shown in FIG. 3N, the contact 330 is in direct contact with the top electrode layer 320, in accordance with some embodiments.

In some embodiments, the contact 330 is made of a single layer or multiple layers of copper, aluminum, tungsten, gold, chromium, nickel, platinum, titanium, iridium, rhodium, an alloy thereof, a combination thereof, or another conductive material.

In some embodiments, the contact 330 is formed by the following processes. In some embodiments, an opening is formed in the second dielectric layer 328 to expose the top electrode layer 320. In some embodiments, the formation of the opening includes patterning the second dielectric layer 328 by a photolithography process and an etching process which etches the exposed surface of the second dielectric layer 328 (for example, by using a dry etching process, a wet etching process, a plasma etching process, or a combination thereof) to form the opening.

Afterwards, a conductive material layer is deposited over the second dielectric layer 328 and fills into the opening. In some embodiments, the conductive material layer is deposited by using chemical vapor deposition (CVD), sputtering, resistive thermal evaporation, electron beam evaporation, or another applicable method.

Afterwards, a planarization process may be used to partially remove the conductive material layer. The conductive material layer may be partially removed until the second dielectric layer 328 is exposed. As a result, the conductive material layer that remains in the opening forms the contact 330. In some embodiments, the planarization process includes a CMP process, a grinding process, a dry polishing process, an etching process, another applicable process, or a combination thereof.

However, the embodiments of the present disclosure are not limited thereto. In some other embodiments, one or more of the bottom electrode layer 304, the first magnetic material layer 308, the tunnel barrier layer 312, the second magnetic material layer 316 and the top electrode layer 320 are not cleaned by producing the gas flow. In some other embodiments, the semiconductor substrate 302 or layers other than the bottom electrode layer 304, the first magnetic material layer 308, the tunnel barrier layer 312, the second magnetic material layer 316 and the top electrode layer 320 are also cleaned by producing the gas flow.

Embodiments of the disclosure use the gas flow to clean the top surface of the material layer. Therefore, the quality and reliability of the semiconductor device structure may be improved. In addition, in some embodiments, the yield of the process for manufacturing the semiconductor device structure may also be improved. In addition, the cleaning process of some embodiments of the present disclosure may reduce or prevent the particle from remaining between two adjacent layers.

In addition, in some embodiments, since the top surface of the material layer is cleaned by the gas flow without using water, the cleaning process of some embodiments of the present disclosure prevents the material of the material layer, for example Mg, from reacting with water. Therefore, in some embodiments, the property of the semiconductor device structure, such as a magnetic tunnel junction memory device structure, would not be changed or damaged, and the quality of the material layer and the semiconductor device structure may be improved.

Embodiments of the disclosure are not limited and may be applied to fabrication processes for any suitable technology generation. Various technology generations include a 20 nm node, a 16 nm node, a 10 nm node, or another suitable node.

Note that the above element sizes, element parameters, and element shapes are not limitations of some embodiments of the present disclosure. Those skilled in the art can adjust these settings or values according to different requirements. It should be understood that the method for cleaning semiconductor device structure of some embodiments of the present disclosure are not limited to FIGS. 2A-2C and 3A-3N. The present disclosure may merely include any one or more features or steps of any one or more embodiments of FIGS. 2A-2C and 3A-3N. In other words, not all of the features or steps shown in the figures should be implemented in the method for cleaning semiconductor device structure of some embodiments of the present disclosure.

In accordance with some embodiments, a method for cleaning a semiconductor device structure is provided. The method includes providing a substrate, forming a material layer over the substrate. The material layer has a top surface. The method further includes cleaning the top surface of the material layer by producing a gas flow on the top surface.

In accordance with some embodiments, a method for cleaning a semiconductor device structure is provided. The method includes providing a substrate, forming a bottom electrode layer over the substrate. The bottom electrode layer has a first top surface. The method further includes cleaning the first top surface of the bottom electrode layer by providing solid nitrogen and/or liquid nitrogen onto the first top surface. The method further includes forming a first magnetic material layer over the first top surface of the bottom electrode layer. The first magnetic material layer has a second top surface. The method further includes cleaning the second top surface of the first magnetic material layer by providing solid nitrogen and/or liquid nitrogen onto the second top surface. The method further includes forming a tunnel barrier layer over the second top surface of the first magnetic material layer. The tunnel barrier layer has a third top surface. The method further includes cleaning the third top surface of the tunnel barrier layer by providing solid nitrogen and/or liquid nitrogen onto the third top surface. The method further includes forming a second magnetic material layer over the third top surface of the tunnel barrier layer. The second magnetic material layer has a fourth top surface. The method further includes cleaning the fourth top surface of the second magnetic material layer by providing solid nitrogen and/or liquid nitrogen onto the fourth top surface. The method further includes and forming a top electrode layer over the fourth top surface of the second magnetic material layer.

In accordance with some embodiments, an apparatus is provided. The apparatus includes a transfer port, a processing chamber connected to the transfer port, a cleaning chamber connected to the transfer port. The transfer port is configured to transfer a wafer between the processing chamber and the cleaning chamber. The apparatus also includes a cleaning substance dispensing unit connected to the cleaning chamber. The cleaning substance dispensing unit is configured to dispense a volatile cleaning substance onto a wafer in the cleaning chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning a semiconductor device structure, comprising:
   providing a substrate;
   forming a material layer over the substrate, wherein the material layer has a top surface; and
   cleaning the top surface of the material layer by producing a first gas flow and a second gas flow together on the top surface,
   wherein the first gas flow is produced by directly supplying a gas via a nozzle from a first direction on the top surface,
   wherein the second gas flow is produced by providing a volatile cleaning substance that is in a solid state and/or a liquid state from a second direction facing the top surface of the material layer onto the top surface, thereby converting the volatile cleaning substance into a gaseous state, and
   wherein the first direction and the second direction are different from each other.

2. The method as claimed in claim 1, wherein the volatile cleaning substance comprises nitrogen, carbon dioxide, oxygen, hydrogen, or a combination thereof.

3. The method as claimed in claim 1, wherein the volatile cleaning substance in the solid state and/or the liquid state has a first volume, whereas the volatile cleaning substance in the gaseous state has a second volume, wherein the second volume is greater than the first volume.

4. The method as claimed in claim 1, wherein the material layer has a temperature in a range from about 20° C. to about 40° C., and the volatile cleaning substance in solid state and/or liquid state has a temperature in a range from about −50° C. to about −220° C.

5. The method as claimed in claim 1, wherein the gas comprises nitrogen gas, helium gas, neon gas, argon gas, clean air, or a combination thereof.

6. The method as claimed in claim 1, wherein the substrate and the material layer are placed in a cleaning chamber to perform the cleaning process, wherein the cleaning chamber has a pressure that is less than atmospheric pressure.

7. The method as claimed in claim 6, wherein the pressure of the cleaning chamber is in a range from about 10 torr to about 100 torr.

8. The method as claimed in claim 1, wherein the first direction is substantially parallel to the top surface of the material layer.

9. The method as claimed in claim 1, wherein the second direction is substantially perpendicular to the top surface of the material layer.

10. A method for cleaning a semiconductor device structure, comprising:
    providing a substrate;
    forming a bottom electrode layer over the substrate, wherein the bottom electrode layer has a first top surface;
    cleaning the first top surface of the bottom electrode layer by providing solid nitrogen and/or liquid nitrogen onto the first top surface;
    forming a first magnetic material layer over the first top surface of the bottom electrode layer, wherein the first magnetic material layer has a second top surface;
    cleaning the second top surface of the first magnetic material layer by providing solid nitrogen and/or liquid nitrogen onto the second top surface;
    forming a tunnel barrier layer over the second top surface of the first magnetic material layer, wherein the tunnel barrier layer has a third top surface;
    cleaning the third top surface of the tunnel barrier layer by providing solid nitrogen and/or liquid nitrogen onto the third top surface;
    forming a second magnetic material layer over the third top surface of the tunnel barrier layer, wherein the second magnetic material layer has a fourth top surface;
    cleaning the fourth top surface of the second magnetic material layer by providing solid nitrogen and/or liquid nitrogen onto the fourth top surface; and
    forming a top electrode layer over the fourth top surface of the second magnetic material layer.

11. The method as claimed in claim 10, wherein after the solid nitrogen and/or liquid nitrogen are provided onto the first top surface, second top surface, third top surface and/or fourth top surface, the solid nitrogen and/or liquid nitrogen is converted into nitrogen gas.

12. The method as claimed in claim 10, wherein during the cleaning process which cleans the first top surface, second top surface, third top surface and/or fourth top surface, the method further comprises:
    providing a gas to the first top surface, second top surface, third top surface and/or fourth top surface.

13. The method as claimed in claim 12, wherein the gas comprises nitrogen gas, helium gas, neon gas, argon gas, clean air, or a combination thereof.

14. The method as claimed in claim 10, wherein the solid nitrogen and/or liquid nitrogen has a temperature in a range from about −150° C. to about −220° C.

15. The method as claimed in claim 10, wherein the bottom electrode layer, the first magnetic material layer, the tunnel barrier layer and/or the second magnetic material layer has a temperature in a range from about 20° C. to about 40° C.

16. A method for cleaning a semiconductor device structure, comprising:
    forming a magnetic tunnel junction stack over a substrate, wherein the magnetic tunnel junction stack has a top surface; and
    cleaning the top surface of the magnetic tunnel junction stack by producing a first gas flow and a second gas flow together on the top surface,
    wherein the first gas flow is produced by directly supplying a gas via a nozzle from a first direction on the top surface,
    wherein the second gas flow is produced by providing a volatile cleaning substance that is in a solid state and/or a liquid state from a second direction facing the top surface of the material layer onto the top surface, thereby converting the volatile cleaning substance into a gaseous state, and wherein the first direction and the second direction are different from each other.

17. The method as claimed in claim 16, wherein a first temperature of the magnetic tunnel junction stack is higher than a second temperature of the volatile cleaning substance in the solid state and/or the liquid state.

18. The method as claimed in claim 16, wherein the second direction is substantially perpendicular to the top surface.

19. The method as claimed in claim 16, wherein the first direction is substantially parallel to the top surface.

20. The method as claimed in claim 16, wherein forming the magnetic tunnel junction stack comprises:
   forming a first magnetic material layer over the substrate;
   forming a tunnel barrier layer over the first magnetic material layer; and
   forming a second magnetic material layer over the tunnel barrier layer.

\* \* \* \* \*